US009786681B1

(12) United States Patent
Ariyoshi

(10) Patent No.: US 9,786,681 B1
(45) Date of Patent: Oct. 10, 2017

(54) MULTILEVEL MEMORY STACK STRUCTURE EMPLOYING STACKS OF A SUPPORT PEDESTAL STRUCTURE AND A SUPPORT PILLAR STRUCTURE

(71) Applicant: SANDISK TECHNOLOGIES LLC, Plano, TX (US)

(72) Inventor: Junichi Ariyoshi, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/186,768

(22) Filed: Jun. 20, 2016

Related U.S. Application Data

(60) Provisional application No. 62/316,883, filed on Apr. 1, 2016.

(51) Int. Cl.
H01L 29/167 (2006.01)
H01L 27/11582 (2017.01)
H01L 27/11556 (2017.01)
H01L 29/417 (2006.01)
H01L 21/265 (2006.01)
H01L 29/66 (2006.01)

(52) U.S. Cl.
CPC .. *H01L 27/11582* (2013.01); *H01L 21/26513* (2013.01); *H01L 27/11556* (2013.01); *H01L 29/167* (2013.01); *H01L 29/41741* (2013.01); *H01L 29/6656* (2013.01)

(58) Field of Classification Search
CPC ......... H01L 27/11582; H01L 27/11556; H01L 21/26513; H01L 29/167; H01L 29/41741; H01L 29/6656
USPC ........................................................ 257/324
See application file for complete search history.

(56) References Cited

U.S. PATENT DOCUMENTS 5,915,167 A 6/1999 Leedy
8,884,357 B2 11/2014 Wang et al.
(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.
U.S. Appl. No. 14/834,830, filed Aug. 25, 2015, SanDisk Technologies Inc.
U.S. Appl. No. 14/834,943, filed Aug. 25, 2015, SanDisk Technologies Inc.
U.S. Appl. No. 14/862,916, filed Sep. 23, 2015, SanDisk Technologies Inc.
(Continued)

Primary Examiner — Mark Tornow
(74) Attorney, Agent, or Firm — The Marbury Law Group PLLC

(57) ABSTRACT

Memory-opening semiconductor material portions and support opening fill structures can be simultaneously formed through a first alternating stack of first insulating layers and first sacrificial material layers. Dopant species that retard or prevent etching of the material of the support opening fill structures can be implanted into an upper portion of each support opening fill structure, while memory-opening semiconductor material portions are masked from implantation. After formation of a second alternating stack and second openings therethrough, the sacrificial material of the memory-opening semiconductor material portions is removed while the support opening fill structures is not removed. Damage to the first sacrificial material layers during formation of the staircase contact region and resulting leakage paths from word lines to the substrate through support pillar structures can be avoided or reduced by not removing the support opening fill structures.

12 Claims, 18 Drawing Sheets

(56) References Cited

U.S. PATENT DOCUMENTS

| | | | |
|---|---|---|---|
| 8,946,023 | B2 | 2/2015 | Makala et al. |
| 9,230,987 | B2 | 1/2016 | Pachamuthu et al. |
| 2010/0320528 | A1* | 12/2010 | Jeong .................... H01L 27/105 257/324 |
| 2011/0287612 | A1* | 11/2011 | Lee .................... H01L 27/11565 438/478 |
| 2012/0276719 | A1* | 11/2012 | Han .................... H01L 29/7926 438/478 |
| 2013/0328005 | A1* | 12/2013 | Shin .................... H01L 27/2436 257/1 |
| 2015/0118811 | A1 | 4/2015 | Makala et al. |
| 2015/0236038 | A1* | 8/2015 | Pachamuthu ..... H01L 27/11582 257/326 |
| 2015/0294978 | A1 | 10/2015 | Lu et al. |
| 2016/0049423 | A1 | 2/2016 | Yoo et al. |

OTHER PUBLICATIONS

U.S. Appl. No. 14/883,966, filed Oct. 15, 2015, SanDisk Technologies Inc.
U.S. Appl. No. 15/015,190, filed Feb. 4, 2016, SanDisk Technologies Inc.
U.S. Appl. No. 15/071,575, filed Mar. 16, 2016, SanDisk Technologies Inc.
U.S. Appl. No. 15/080,269, filed Mar. 24, 2016, SanDisk Technologies Inc.
U.S. Appl. No. 15/183,195, filed Jun. 15, 2016, SanDisk Technologies LLC.

* cited by examiner

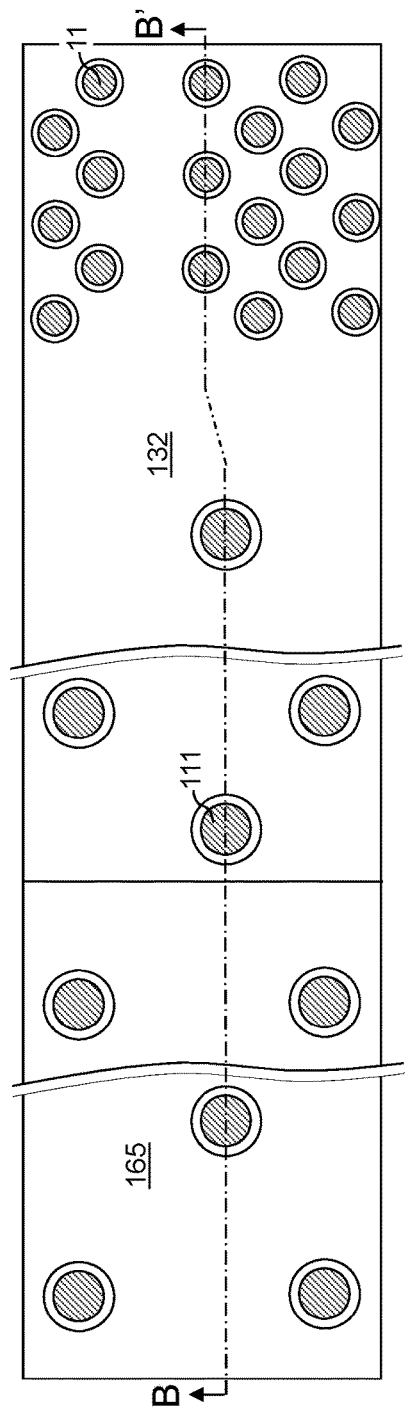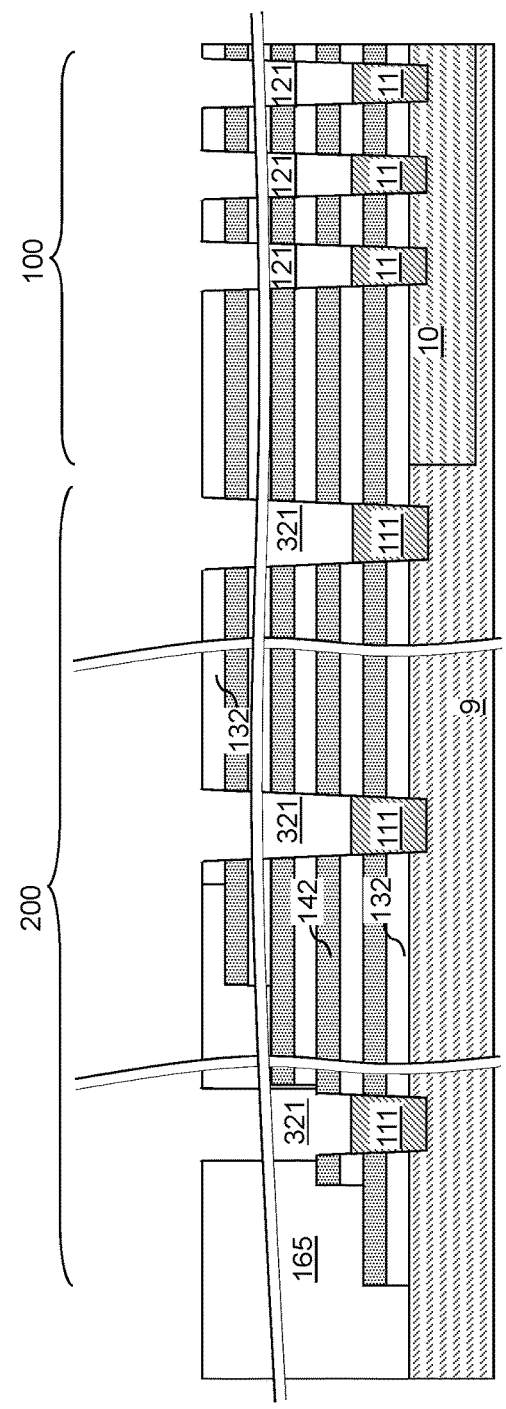
FIG. 4A
FIG. 4B

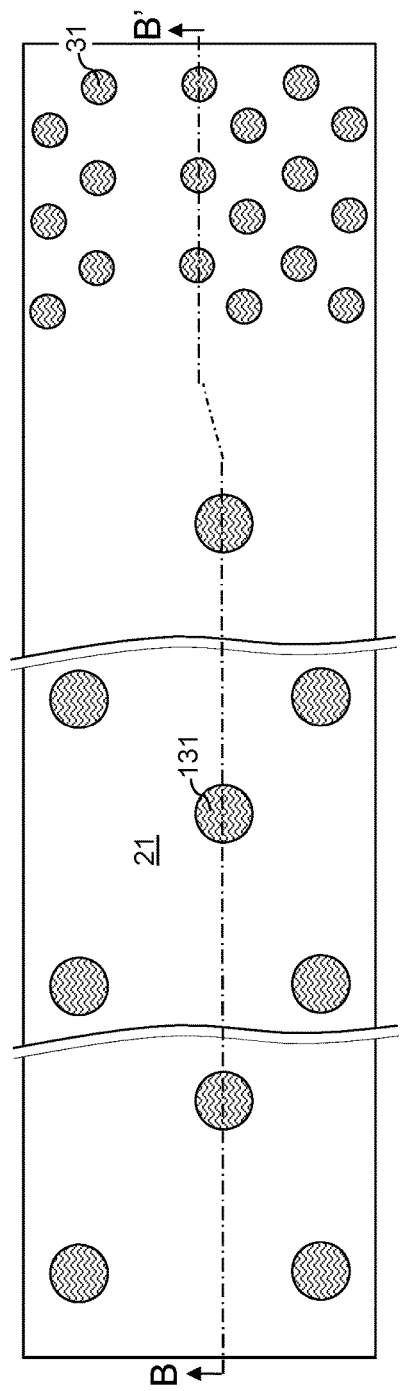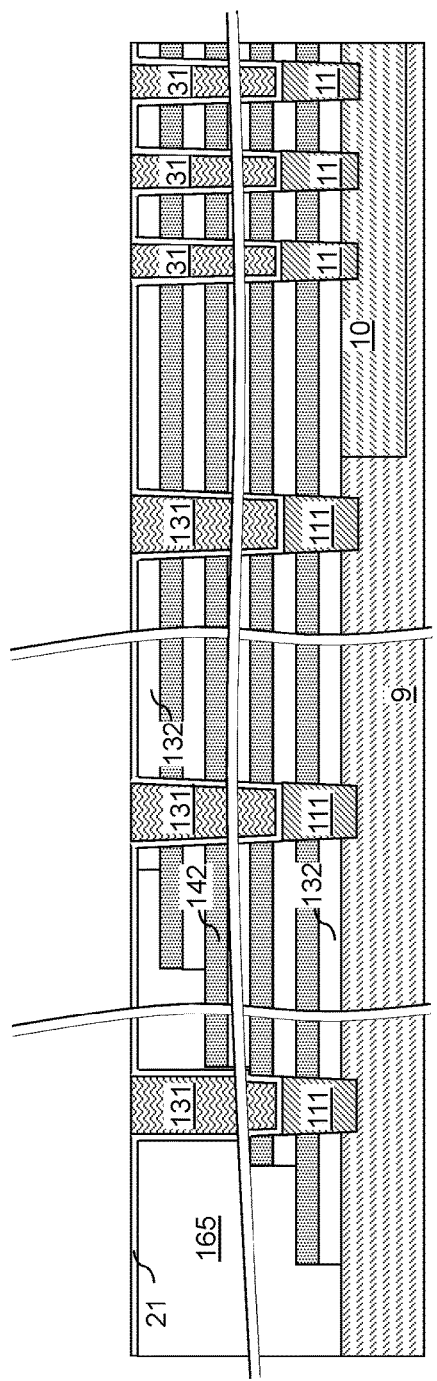

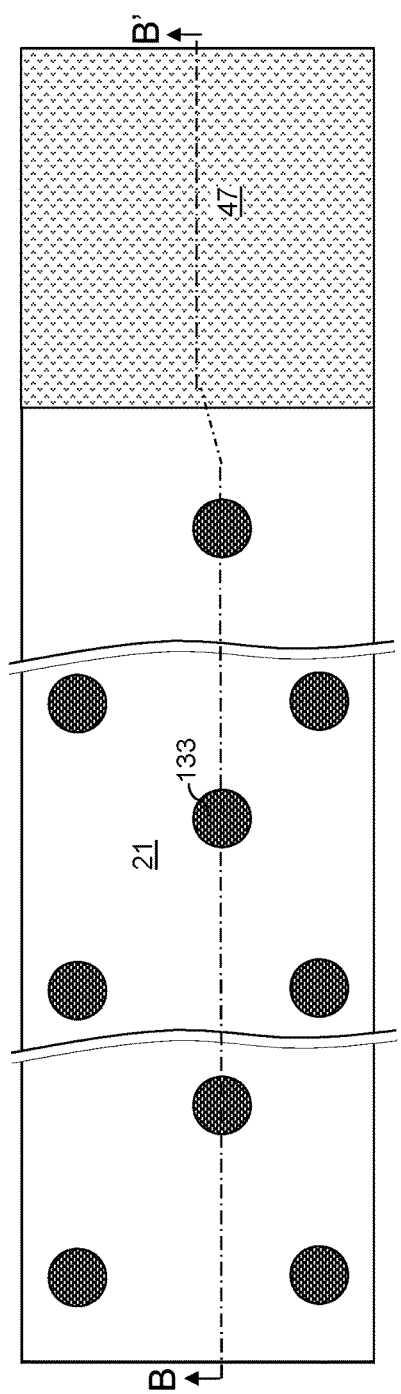
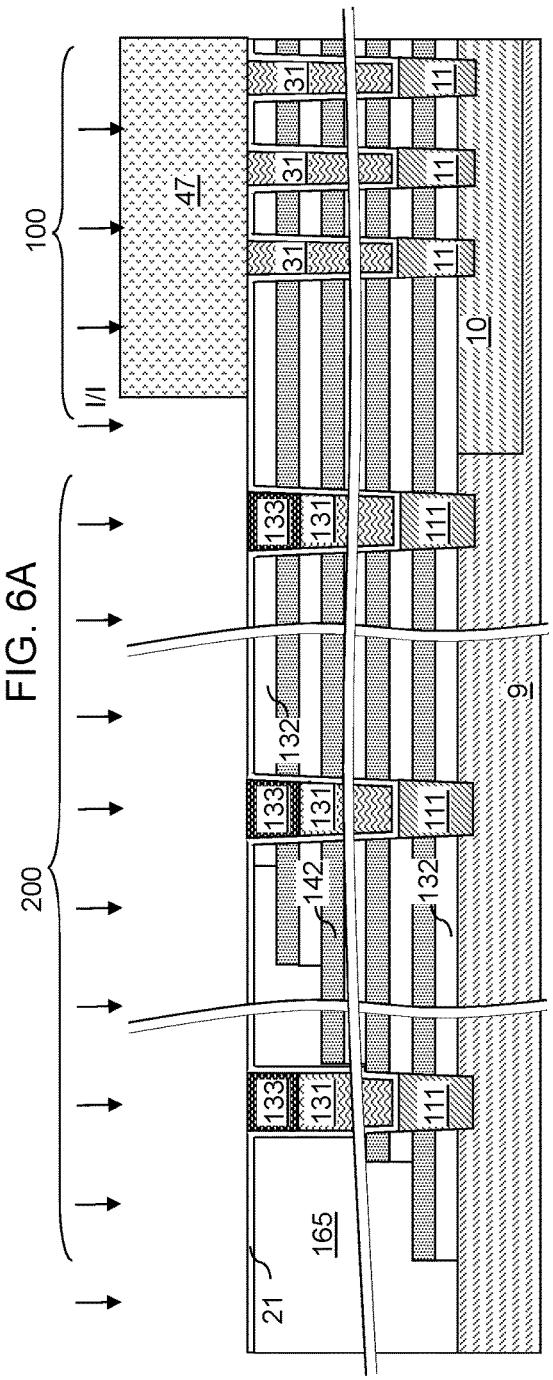
FIG. 6A
FIG. 6B

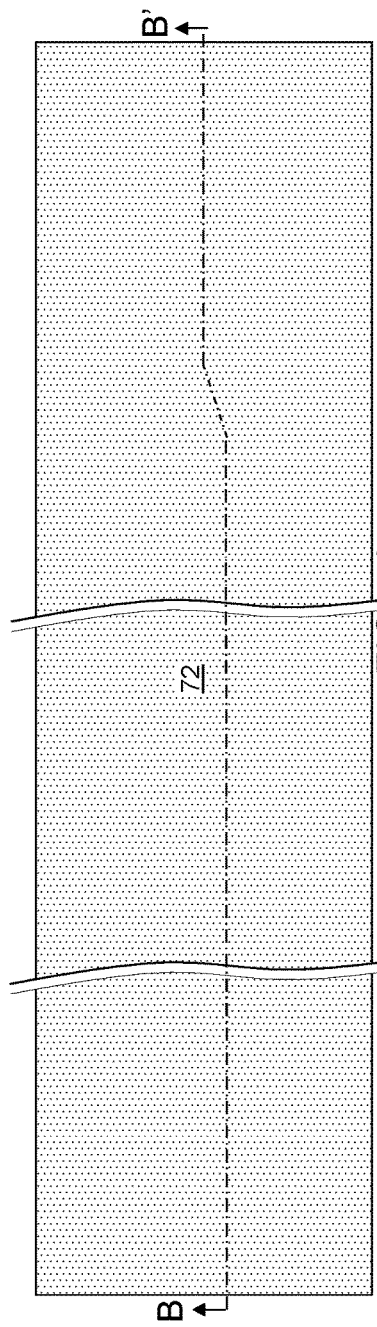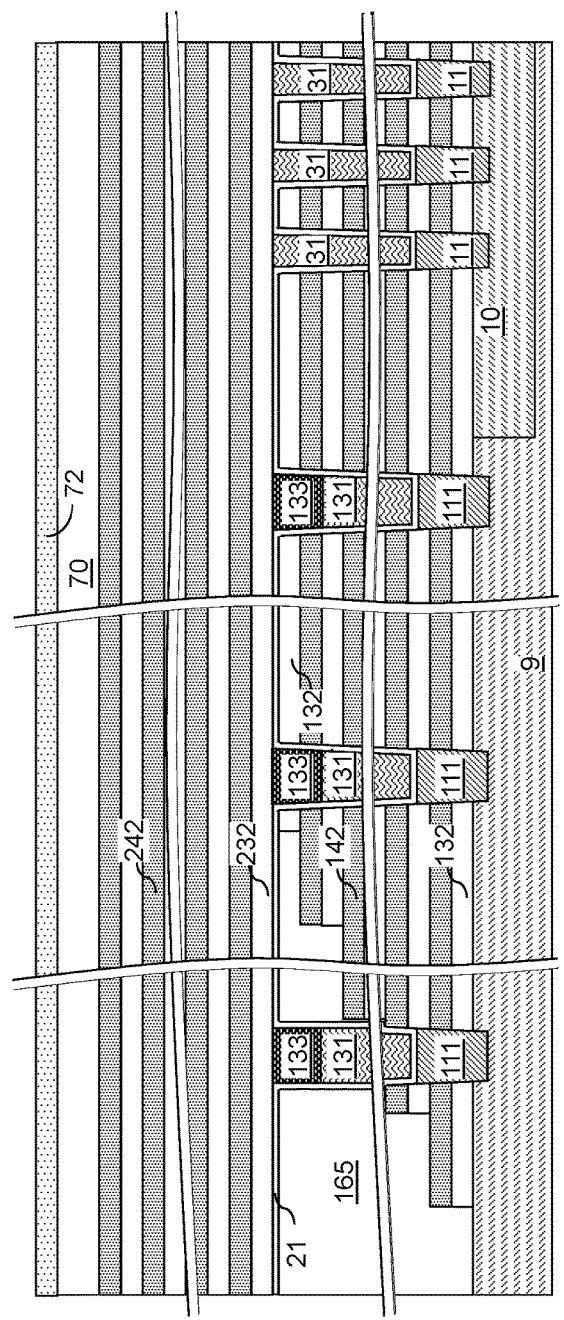

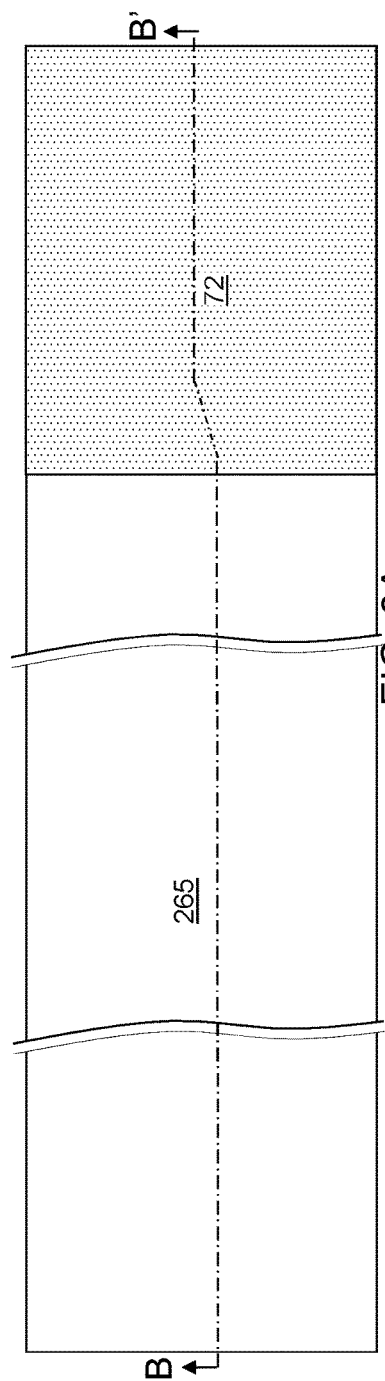
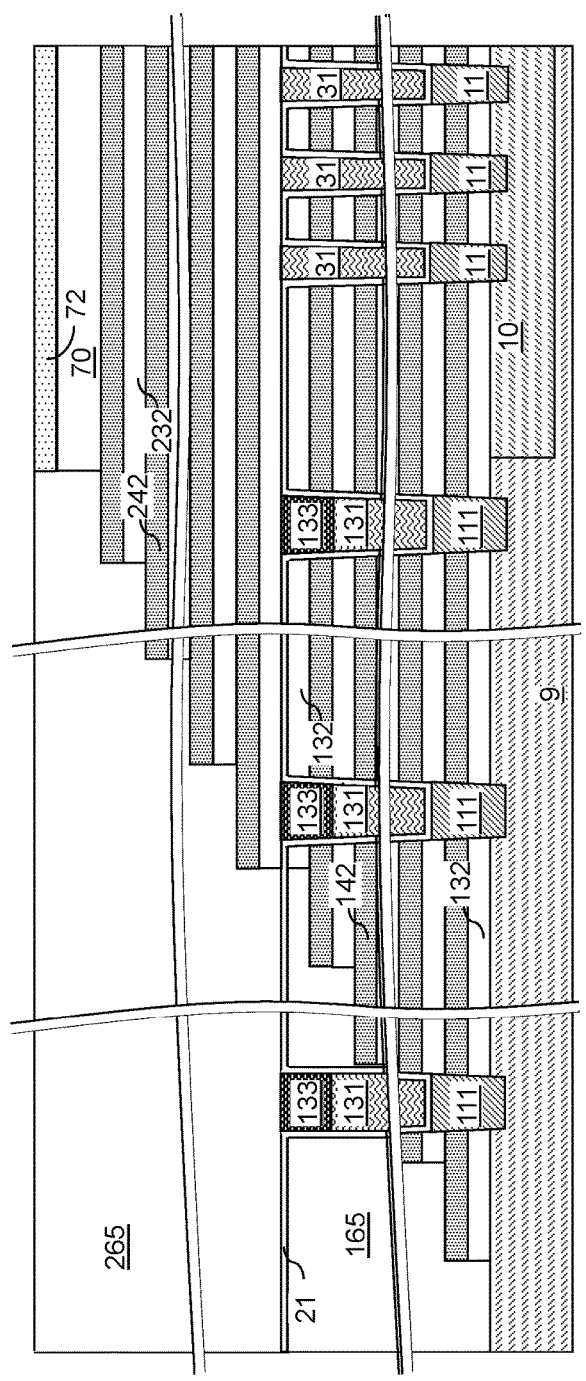
FIG. 8A
FIG. 8B

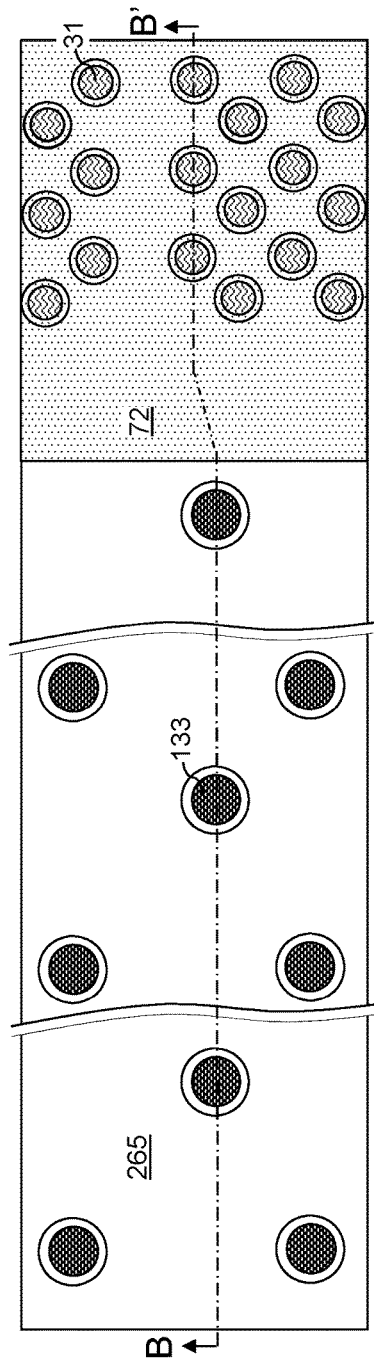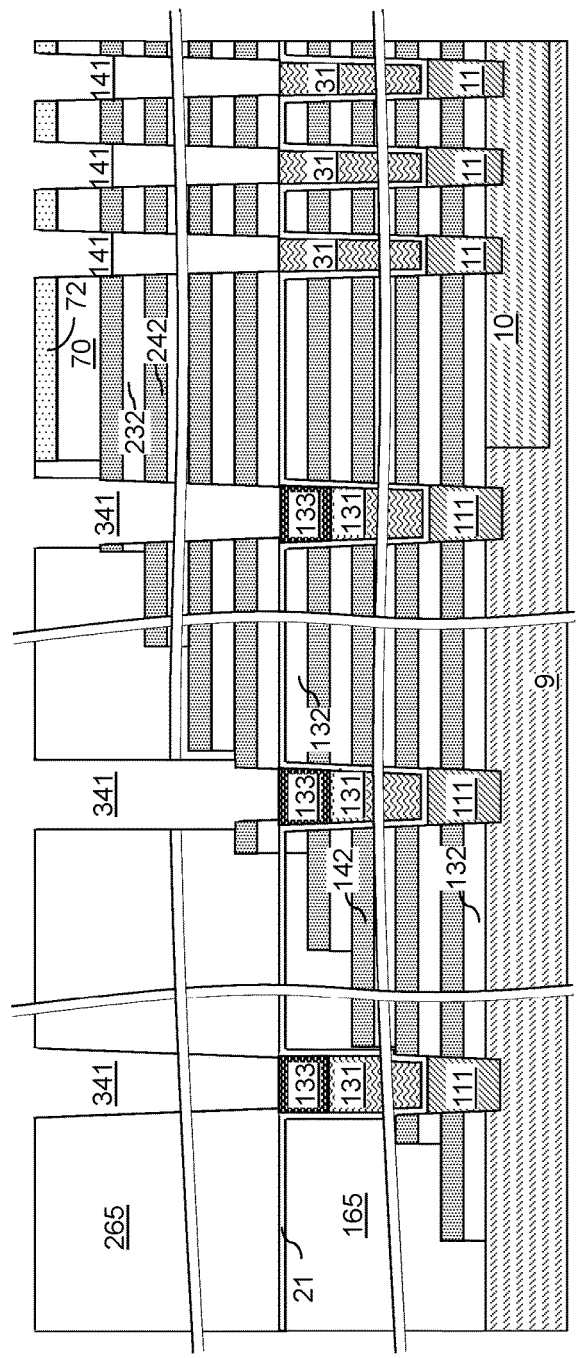
FIG. 9A
FIG. 9B

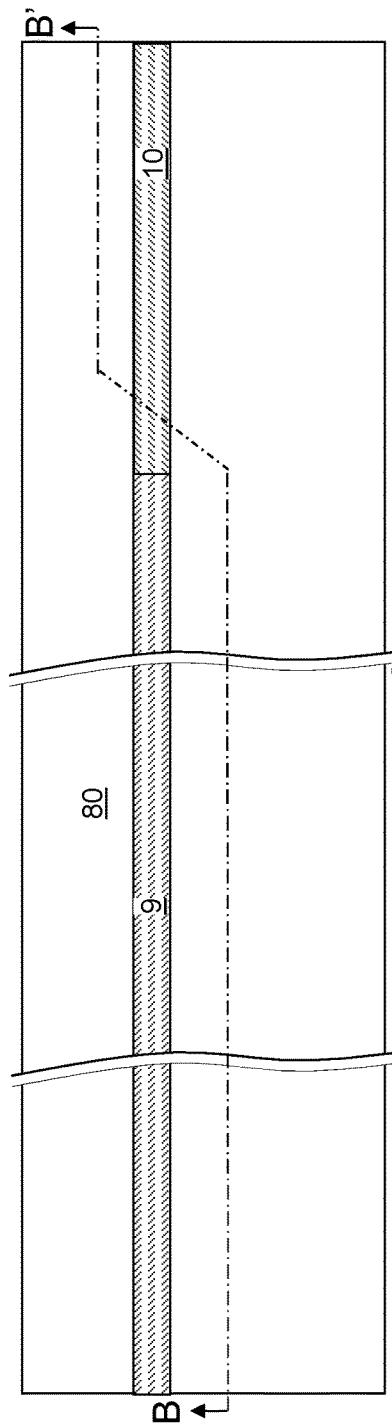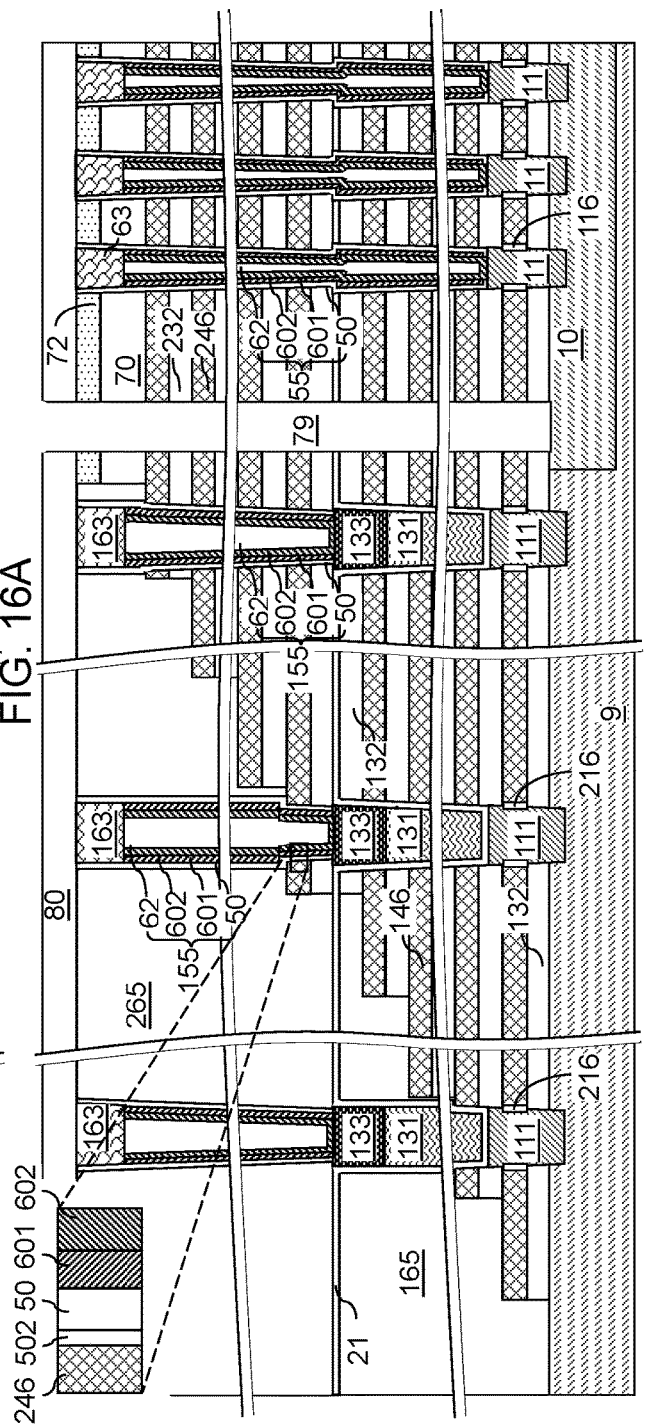
FIG. 16A
FIG. 16B

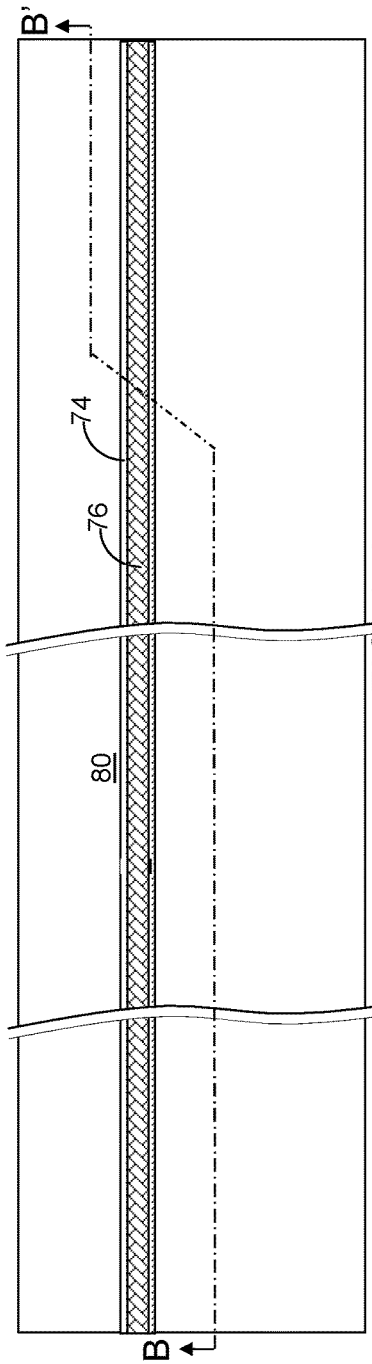
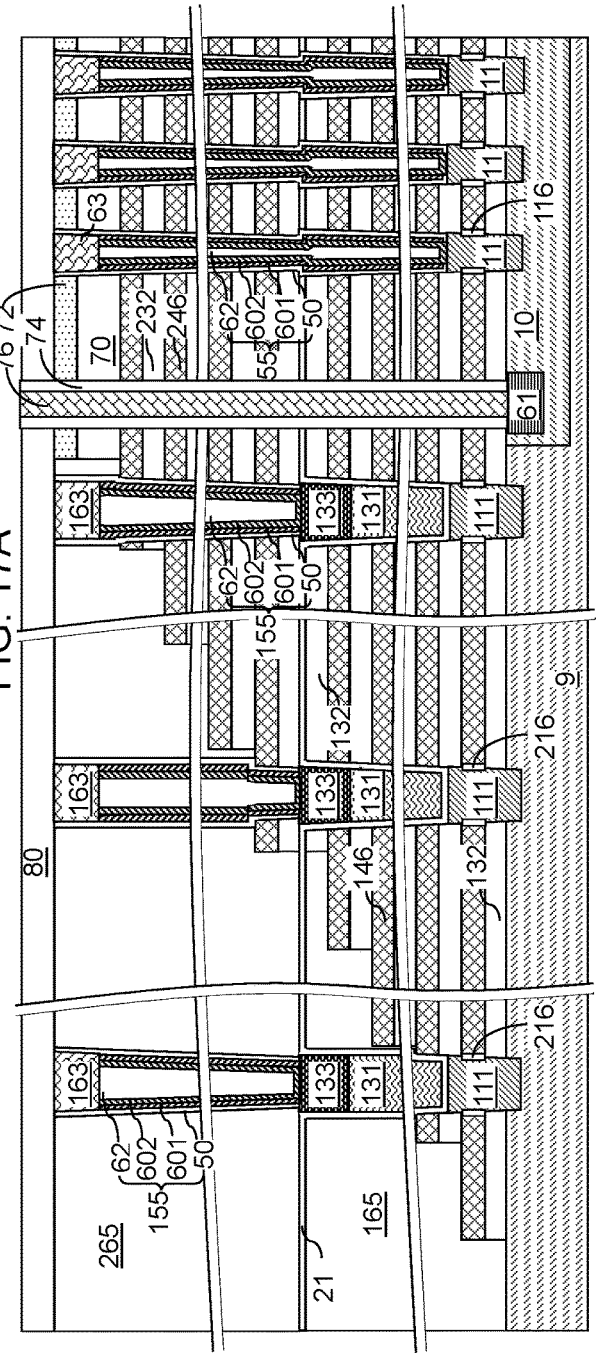
FIG. 17A
FIG. 17B

MULTILEVEL MEMORY STACK STRUCTURE EMPLOYING STACKS OF A SUPPORT PEDESTAL STRUCTURE AND A SUPPORT PILLAR STRUCTURE

FIELD

The present invention relates generally to the field of three-dimensional memory devices and specifically to three-dimensional memory devices including a vertical stack of multilevel memory arrays and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises a lower tier structure comprising a first alternating stack of first insulating layers and first electrically conductive layers and located over a substrate; an upper tier structure comprising a second alternating stack of second insulating layers and second electrically conductive layers and located over the lower tier structure; memory stack structures extending through the second alternating stack and an upper portion of the first alternating stack; and support pillar structures extending through the second alternating stack. Each of the memory stack structures and support pillar structures comprises a respective vertical semiconductor material layer; and each vertical semiconductor material layer in the support pillar structures has a bottommost surface located above a horizontal plane including bottommost surfaces of vertical semiconductor material layers within the memory stack structures.

According to another aspect of the present disclosure, a method of forming a three-dimensional memory device is provided. A lower tier structure including a first alternating stack of first insulating layers and first spacer material layers is formed over a substrate. An upper tier structure including a second alternating stack of second insulating layers and second spacer material layers is formed over the lower tier structure. Inter-stack memory openings extending through the upper and lower tier structures and upper tier support openings extending through the upper tier structure are formed. Memory stack structures are formed in the inter-stack memory openings and support pillar structures are formed in the upper tier support openings. Bottommost surfaces of the memory stack structures are formed below a horizontal plane including bottommost surfaces of the support stack structures.

According to yet another aspect of the present disclosure, a method of forming a three-dimensional memory device is provided. The method includes steps of: forming a lower tier structure over a substrate, wherein the lower tier structure comprises a first stack of alternating layers including first insulating layers and first sacrificial material layers; forming first memory openings and first support openings through the lower tier structure; forming memory-opening semiconductor material portions and support-opening semiconductor material portions in the first memory openings and the first support openings, respectively; forming support opening fill structures by implanting a dopant species into each upper portion of the support-opening semiconductor material portions while preventing implantation of the dopant species into the memory-opening semiconductor material portions, wherein each support opening fill structure includes a vertical stack of a doped semiconductor material portion and an underlying semiconductor material portion that is a remaining portion of one of the support-opening semiconductor material portions; forming an upper tier structure over the lower tier structure, wherein the upper tier structure comprises a second stack of alternating layers including second insulating layers and second sacrificial material layers; forming second memory openings and second support openings over the first memory openings and the support opening fill structures, respectively; forming inter-stack memory openings by removing the memory-opening semiconductor material portions from underneath the second memory openings while not removing the support opening fill structures; and simultaneously forming a memory stack structure in each of the inter-stack memory openings and a support pillar structure in each of the second support openings.

BRIEF DESCRIPTION OF THE DRAWINGS

FIG. 4A is a top-down view of the exemplary structure after formation of epitaxial semiconductor portions according to an embodiment of the present disclosure.

FIG. 4B is a vertical cross-sectional view of the exemplary structure of FIG. 4A along the vertical plane B-B'.

FIG. 5A is a top-down view of the exemplary structure after formation of an etch stop layer and semiconductor material portions according to an embodiment of the present disclosure.

FIG. 5B is a vertical cross-sectional view of the exemplary structure of FIG. 5A along the vertical plane B-B'.

FIG. 6A is a top-down view of the exemplary structure after implantation of a dopant species into upper portions of the support-opening semiconductor material portions according to an embodiment of the present disclosure.

FIG. 6B is a vertical cross-sectional view of the exemplary structure of FIG. 6A along the vertical plane B-B'.

FIG. 7A is a top-down view of the exemplary structure after formation of a second alternating stack of second insulating layers according to an embodiment of the present disclosure.

FIG. 7B is a vertical cross-sectional view of the exemplary structure of FIG. 7A along the vertical plane B-B'.

FIG. 8A is a top-down view of the exemplary structure after formation of second stepped surfaces within the stepped surface region and a second dielectric material portion according to an embodiment of the present disclosure.

FIG. 8B is a vertical cross-sectional view of the exemplary structure of FIG. 8A along the vertical plane B-B'.

FIG. 9A is a top-down view of the exemplary structure after formation of second memory openings in the device region and second support openings in the stepped surface region according to an embodiment of the present disclosure.

FIG. 9B is a vertical cross-sectional view of the exemplary structure of FIG. 9A along the vertical plane B-B'.

FIG. 16A is a top-down view of the exemplary structure after formation of electrically conductive layers according to an embodiment of the present disclosure.

FIG. 16B is a vertical cross-sectional view of the exemplary structure of FIG. 16A along the vertical plane B-B'.

FIG. 17A is a top-down view of the exemplary structure after formation of an insulating spacer and a backside contact via structure according to an embodiment of the present disclosure.

FIG. 17B is a vertical cross-sectional view of the exemplary structure of FIG. 17A along the vertical plane B-B'.

DETAILED DESCRIPTION

Figure 1:
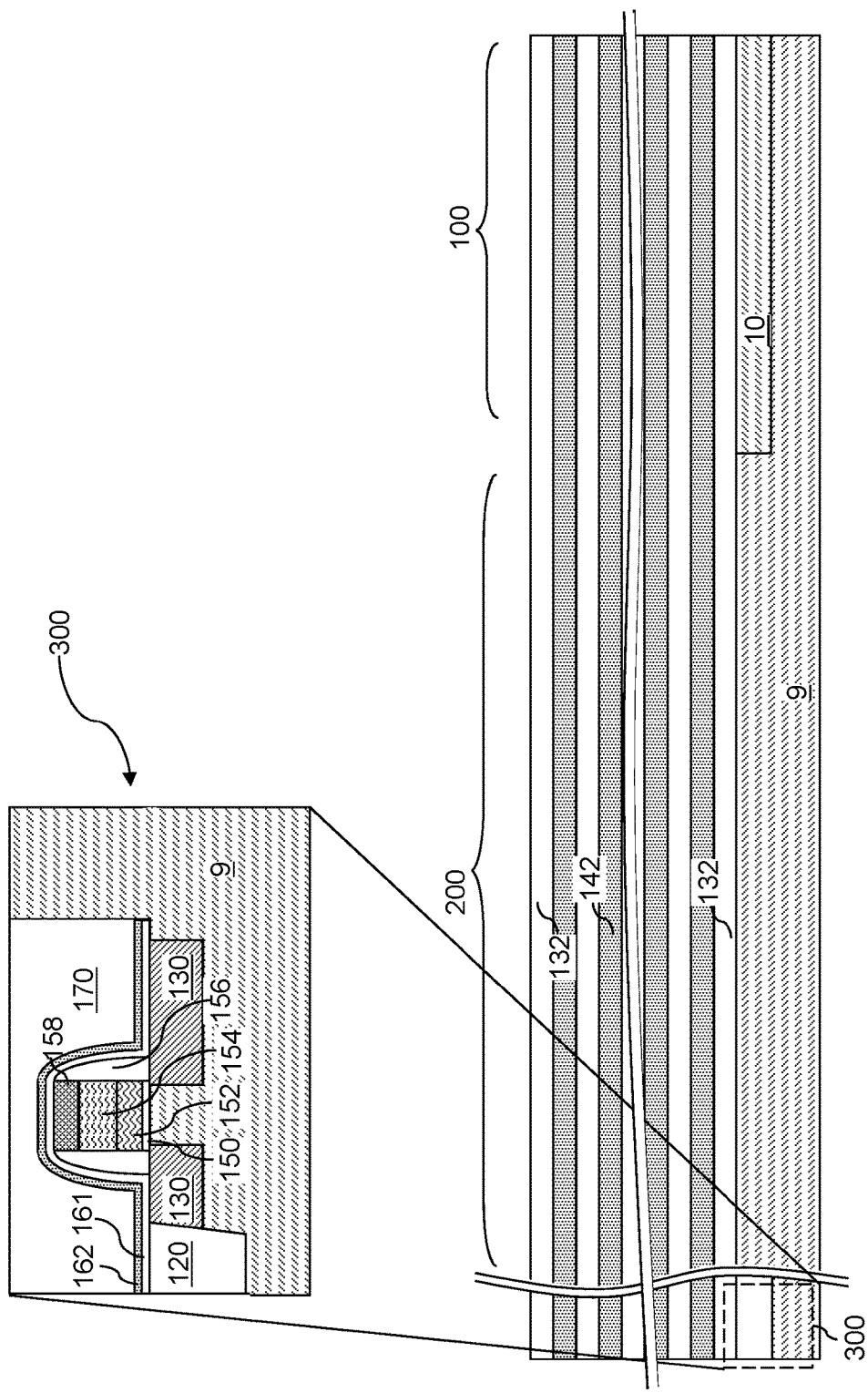
FIG. 1 is a vertical cross-sectional view of an exemplary structure after formation of a first alternating stack of first insulating layers and first sacrificial material layers and subsequent formation of an etch stop dielectric layer according to an embodiment of the present disclosure.

As discussed above, the present disclosure is directed to three-dimensional memory devices including a vertical stack of multilevel memory arrays and methods of making the same, the various aspects of which are described below.

An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 9 can comprise a single crystalline semiconductor material, such as a single crystal silicon wafer. A doped semiconductor well 10 may be optionally formed in an upper portion of the substrate semiconductor layer 9 by implanting p-type dopants or n-type dopants. The combination of the remaining portion of the substrate semiconductor layer 9 and the doped semiconductor well 10 is herein referred to as a semiconductor substrate (9, 10).

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the semiconductor substrate (9, 10).

The first exemplary structure includes a memory array region 100, in which memory devices can be subsequently formed, and a contact region 200, in which stepped surfaces are subsequently formed. As used herein, a "contact region" refers to a region in which contact via structures are to be formed. At least one semiconductor device for a peripheral circuitry can be formed in a peripheral device region 300.

The at least one semiconductor device formed in the peripheral device region 300 can include, for example, one or more field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional doped semiconductor well 10 can be formed in an upper portion of the substrate semiconductor layer 9 by ion implantation of electrical dopants (such as p-type dopants or n-type dopants), or on the top surface of the substrate semiconductor layer 9 by deposition of a single crystalline semiconductor material, for example, by selective epitaxy. In one embodiment, the optional doped semiconductor well 10 can be formed in a memory array region 100 in which a memory array is subsequently formed. A contact region 200 can be provided between the memory array region 100 and the peripheral device region 300. A contact region 200 is a region in which word line contact via structures are subsequently formed.

In case an epitaxial deposition process is employed, the deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the doped semiconductor well 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the doped semiconductor well 10 can have a top surface that is coplanar with the top surface of the planarization dielectric layer 170.

An alternating stack of first material layers and second material layers is subsequently formed. Each first material layer can include a first material, and each second material layer can include a second material that is different from the first material. The first material layers can be insulating layers, and the second material layers can be spacer material layers that provide vertical spacing between each vertically neighboring pair of insulating layers. In one embodiment, the spacer material layers can be dielectric material layers, which are herein referred to as spacer dielectric layers. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first alternating stack (132, 142), or a lower alternating stack (132, 142). In this case, the stack can include an alternating plurality of first insulating layers 132 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142. The first alternating stack (132, 142) constitutes a lower tier structure that occupies a volume above the semiconductor substrate (9, 10).

Figure 2:
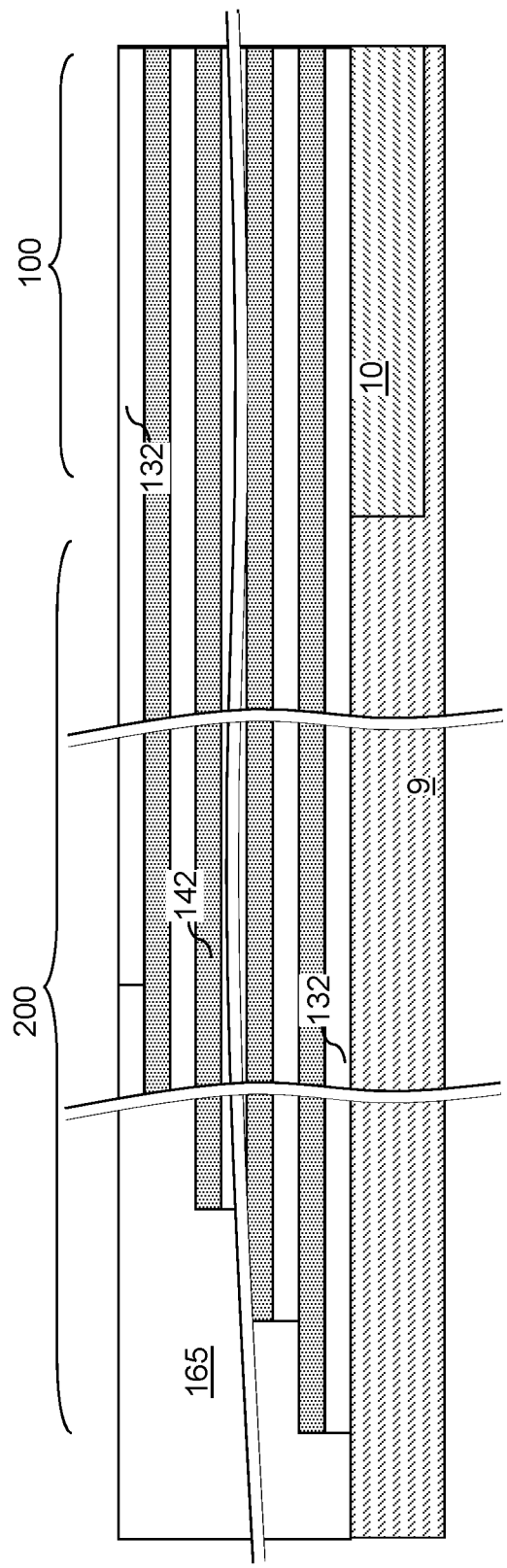
FIG. 2 is a vertical cross-sectional view of the exemplary structure after formation of first stepped surfaces and a first dielectric material portion according to an embodiment of the present disclosure.

Referring to FIG. 2, the lower tier structure (132, 142) can be patterned to form first stepped surfaces, which are also referred to as first stepped terraces. The first stepped terraces are formed in the contact region 200. The contact region 200 includes a first stepped area in which the first stepped surfaces are formed, and a second stepped area in which additional stepped surfaces are to be subsequently formed in an upper tier structure (to be subsequently formed over the lower tier structure). The memory array region 100 is provided adjacent to the contact region 200. Memory devices including memory stack structures can be subsequently formed in the memory array region 100. The first stepped surfaces can be formed, for example, by forming a mask layer with an opening therein, etching a cavity within the levels of the topmost first sacrificial material layer 142 and the topmost first insulating layer 132, and iteratively expanding the etched area and vertically recessing the cavity by etching each pair of a first insulating layer 132 and a first sacrificial material layer 142 located directly underneath the bottom surface of the etched cavity within the etched area. The first alternating stack (132, 142) is patterned such that each underlying first sacrificial material layer 142 laterally protrudes farther than any overlying first sacrificial material layer 142 in the etched region, and each underlying first insulating layer 132 laterally protrudes farther than any overlying first insulating layer 132 in the etched region. Thus, within the area of the first stepped terraces, each spacer material layer (such as the first sacrificial dielectric layer 142) laterally extends farther than any overlying spacer material layer within the first alternating stack (132, 142). The contact region can be a contact region of the first alternating stack (132, 142). The cavity is herein referred to as a first stepped cavity.

A dielectric material is deposited to fill the first stepped cavity. Excess portions of the dielectric material overlying the topmost surface of the first alternating stack (132, 142), are removed for example, by chemical mechanical planarization. The remaining portion of the deposited dielectric material forms a first retro-stepped dielectric material portion 165, which is formed on the first stepped surfaces. The first dielectric material portion 165 is retro-stepped. As used herein, a "retro-stepped" element refers to an element that has stepped surfaces and a horizontal cross-sectional area that increases monotonically as a function of a vertical distance from a top surface of a substrate on which the element is present. Upon formation of the first retro-stepped dielectric material portion 165, the lower tier structure comprises the first alternating stack (132, 142) and the first retro-stepped dielectric material portion 165.

Figure 3A:
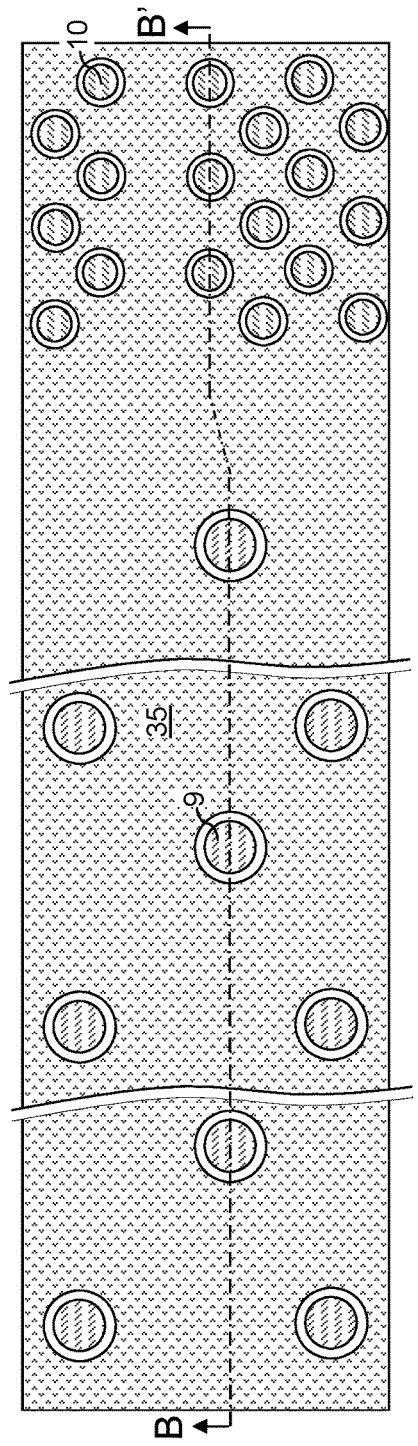
FIG. 3A is a top-down view of the exemplary structure after formation of first memory openings in a memory array region and first support openings in a stepped surface region according to an embodiment of the present disclosure.
Figure 3B:
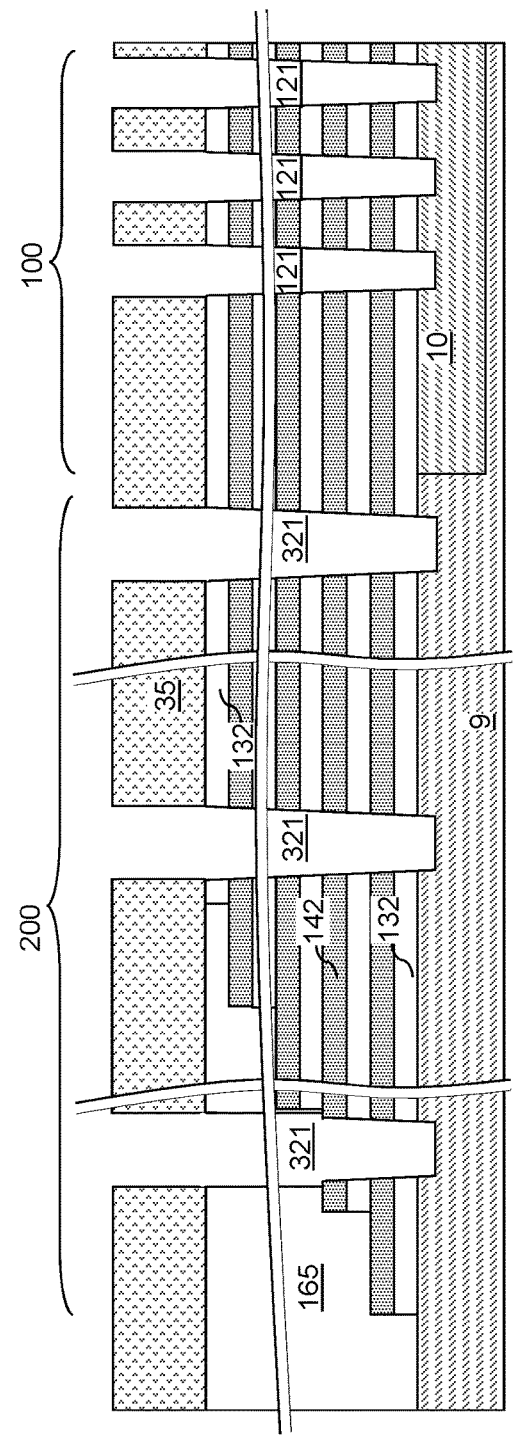
FIG. 3B is a vertical cross-sectional view of the exemplary structure of FIG. 3A along the vertical plane B-B'.

Referring to FIGS. 3A and 3B, a photoresist layer 35 can be applied over the lower tier structure (132, 142, 165), and is lithographically patterned to form openings in the memory array region 100 and the contact region 200. The pattern in the photoresist layer 35 is transferred through the lower tier structure (132, 142, 165) to form first openings (121, 321) through the lower tier structure to a top surface of the substrate (9, 10).

The first openings (121, 321) include first memory openings 121 that are formed in the memory array region 100 and first support openings 321 that are formed in the contact region 200. The first memory openings 121 are herein referred to as lower tier memory openings, and the first support openings 321 are herein referred to as lower tier support openings. For example, a lithographic material stack 35 including at least a photoresist layer can be formed over the lower tier structure (132, 142, 165), and can be lithographically patterned to form openings within the lithographic material stack. The pattern in the lithographic material stack can be transferred through the entirety of the lower tier structure (132, 142, 165) by at least one anisotropic etch that employs the patterned lithographic material stack as an etch mask. Portions of the lower tier structure (132, 142, 165) underlying the openings in the patterned lithographic material stack are etched to form the first openings (121, 321). In other words, the transfer of the pattern in the patterned lithographic material stack through the lower tier structure (132, 142, 165) forms the first openings (121, 321).

In one embodiment, the chemistry of the anisotropic etch process employed to etch through the materials of the first alternating stack (132, 142) can alternate to optimize etching of the first and second materials in the first alternating stack (132, 142) while providing a comparable average etch rate for the first dielectric material portion 165. The anisotropic etch can be, for example, a series of reactive ion etches. The sidewalls of the first openings (121, 321) can be substantially vertical, or can be tapered. Subsequently, the patterned lithographic material stack can be subsequently removed, for example, by ashing.

The first support opening 321 are formed through the first alternating stack (132, 142) and through one of the first dielectric material portion 165 in the contact region 200 concurrently with formation of the first memory openings 121 in the memory array region 100. Due to the compositional changes at the interface between the first retro-stepped dielectric material portion 165 and the first sacrificial material layers 142 contacting horizontal bottom surfaces of the first retro-stepped dielectric material portion 165, surface damage can be introduced around the first support openings 321 on the top surfaces of the first sacrificial material layers 142 that contact the first retro-stepped dielectric material portion 165. In addition, a stepwise narrowing of the first support openings 321 may be present at the interface between the first retro-stepped dielectric material portions 165 and the underlying first sacrificial material layers 142.

In one embodiment, the substrate (9, 10) can be employed as a stopping layer for the anisotropic etch process. In one embodiment, the first openings (121, 321) may extend below the top surface of the substrate (9, 10) by an overetch. The lateral dimensions (e.g., a diameter) of the first openings (121, 321) can be from about 20 nm to 200 nm at an upper portion of each first opening (121, 321), and can be about 10 nm to 150 nm at a lower portion of each first opening (121, 321), although lesser and greater dimensional can also be employed. In one embodiment, the first memory openings 121 can be formed as an array of openings, which can be a periodic two-dimensional array of openings. The first support openings 321 can be formed as discrete openings that are mutually separated from one another, and may not form a periodic two-dimensional array pattern. The nearest neighbor lateral separation distance among the first support openings 321 may be greater than twice (e.g., three times or more) than the nearest neighbor distance among the first memory openings 121.

Referring to FIGS. 4A and 4B, optional epitaxial semiconductor portions (11, 111) can be formed by a selective epitaxy process. The epitaxial semiconductor portions (11, 111) can include first epitaxial semiconductor portions 11 that are formed at the bottom of each first memory opening 121 and second epitaxial semiconductor portions 111 that are formed at the bottom of each first support opening 321. The epitaxial semiconductor portions (11, 111) are grown from physically exposed surfaces the semiconductor substrate (9, 10) located at the bottom of the first memory openings 121 and the first support openings 321. In one embodiment, the epitaxial semiconductor portions (11, 111) comprise a single crystalline semiconductor material in epitaxial alignment with the single crystalline substrate semiconductor material of the semiconductor substrate (9, 10). Optionally, the epitaxial semiconductor portions (11, 111) can be doped with electrical dopants of a suitable conductivity type. In one embodiment, the doped semiconductor well 10 and the epitaxial semiconductor portions (11, 111) can have a doping of the first conductivity type (e.g., p-type).

The selective epitaxy process that forms the epitaxial semiconductor portions (11, 111) can be performed, for example, by sequentially or simultaneously flowing a reactant gas (such as $SiH_4$, $SiH_2Cl_2$, $SiHCl_3$, $SiCl_4$, $Si_2H_6$, $GeH_4$, $Ge_2H_6$, other semiconductor precursor gases, or combinations there) with an etchant gas (such as HCl). The deposition rate of the semiconductor material on amorphous surfaces (such as the surfaces of dielectric materials) is less than the etch rate of the semiconductor material by the etchant, while the deposition rate of the semiconductor material on crystalline surfaces (such as the top surface of the semiconductor substrate (9, 10)) is greater than the etch rate of the semiconductor material by the etchant. Thus, the semiconductor material is deposited only on the semiconductor surfaces at the bottom of the first openings (121, 321), which are the physically exposed portion of the top surface of the semiconductor substrate (9, 10). The process conditions (such as the deposition temperature, the partial pressure of the various gases in a process chamber, etc.) can be selected such that the deposited semiconductor material is an epitaxial semiconductor material, i.e., single crystalline silicon or another semiconductor material with atomic alignment with the single crystalline structure of the semiconductor substrate (9, 10) (e.g., p-well). In one embodiment, the top surface of each epitaxial semiconductor portion (11, 111) can be formed above a horizontal plane including the top surface of the bottommost sacrificial material layer 42 and below a horizontal plane including a bottom surface of the bottommost sacrificial material layer 42.

Referring to FIGS. 5A and 5B, an optional etch stop layer 21 can be formed on the physically exposed surfaces of the first openings (121, 321), the epitaxial semiconductor portions (11, 111), and over the first alternating stack (132, 142). The etch stop layer 21 can include a single dielectric (i.e., electrically insulating) material layer or a plurality of dielectric material layers. The etch stop layer 21 can be deposited on the sidewalls of each first opening (121, 321) by a conformal deposition method. In one embodiment, the etch stop layer 21 can include silicon oxide or a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the etch stop layer 21 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The etch stop layer 21 can be deposited, for example, by chemical vapor deposition (CVD), atomic layer deposition (ALD), pulsed laser deposition (PLD), liquid source misted chemical deposition, or a combination thereof. The thickness of the etch stop layer 21 can be in a range from 1 nm to 20 nm, although lesser and greater thicknesses can also be employed. The etch stop layer 21 can subsequently function as a dielectric material portion that blocks leakage of stored electrical charges to control gate electrodes. In one embodiment, the etch stop layer 21 includes aluminum oxide.

Additionally or alternatively, the etch stop layer 21 can include a silicon-based dielectric material such as silicon oxide, silicon oxynitride, silicon nitride, or a combination thereof. In one embodiment, the etch stop layer 21 can include silicon oxide. The silicon-based dielectric material can be formed by a conformal deposition method such as low pressure chemical vapor deposition, atomic layer deposition, or a combination thereof. The thickness of the silicon-based dielectric material, if present, can be in a range from 1 nm to 20 nm, although lesser and greater thicknesses can also be employed. Alternatively, the etch stop layer 21 can be omitted, and a blocking dielectric layer can be formed after formation of backside recesses by a conformal deposition process on surfaces of memory films to be subsequently formed.

A sacrificial semiconductor material layer is deposited in the cavities of the first memory openings 121 and the first support openings 321, and over the alternating stack (132, 142) and the etch stop layer 21. The sacrificial semiconductor material layer includes a sacrificial semiconductor material that can be removed selective to the material of the etch stop layer 21. In one embodiment, etch rate of the undoped sacrificial semiconductor material is greater than that of the doped sacrificial semiconductor material to permit selective removal of the undoped sacrificial semiconductor material from the memory region 100 compared to the doped sacrificial semiconductor material from the contact region 200. For example, the sacrificial semiconductor material can include amorphous or polycrystalline silicon-containing material such as intrinsic amorphous or polycrystalline silicon or a silicon-germanium alloy. In one embodiment, the sacrificial semiconductor material layer can be deposited employing a conformal or a non-conformal deposition process. If a non-conformal deposition process is employed, a cavity may be formed within one or more of the first memory openings 121 and/or the first support openings 321.

A planarization process is performed to remove portions of the sacrificial semiconductor material layer from above an alternating stack (132, 142) of the first insulating layers 132 and the first sacrificial material layers 142. In one embodiment, a chemical mechanical planarization (CMP) process can be employed to remove the sacrificial semiconductor material layer from above the alternating stack (132, 142). Optionally, the horizontal portion of the etch stop layer 21 can be employed as a stopping layer for the CMP process. In one embodiment, the horizontal portion of the etch stop layer 21 can be subsequently removed, for example, by an isotropic etch process or by a touch-up polish process. Alternatively, the horizontal portions of the etch stop layer 21 may remain over the alternating stack (132, 142) after the planarization process.

Each remaining portion of the sacrificial semiconductor material in a first memory opening 121 constitutes a memory-opening semiconductor material portion 31. Each remaining portion of the sacrificial semiconductor material in a first support opening 321 constitutes a support-opening semiconductor material portion 131. Each of the memory-opening semiconductor material portions 31 and the support-opening semiconductor material portions 131 can include a substantially intrinsic semiconductor material that is not a conductive material. As used herein, a semiconductor material is substantially intrinsic if the dopant concentration does not exceed $1.0 \times 10^{16}/cm^3$. For example, each of the memory-opening semiconductor material portions 31 and the support-opening semiconductor material portions 131 include an amorphous or polycrystalline substantially intrinsic silicon-containing semiconductor material (such as silicon, a silicon-germanium alloy, a silicon-carbon alloy, or a silicon-germanium-carbon alloy, for example intrinsic amorphous silicon). In one embodiment, the memory-opening semiconductor material portions 31 can form a two-dimensional array, which may have a periodicity along two different horizontal directions. A vertical portion of the etch stop layer 21 is present directly on sidewalls of the first memory opening 121 and first support openings 321.

Referring to FIGS. 6A and 6B, a masking layer, such as a photoresist layer 47 can be applied over the lower tier structure (132, 142, 165, 31, 131), and can be lithographically patterned to cover the memory array region 100, while not covering the contact region 200.

Ions of a dopant species that can retard etching of the semiconductor material in the support-opening semiconductor material portions 131 can be implanted into upper portions of the support-opening semiconductor material portions 131. The patterned photoresist layer 47 prevents the ions of the dopant species from being implanted into the memory-opening semiconductor material portions 31. Upper portions of the support-opening semiconductor material portions 131 are converted into doped semiconductor material portions 133, such as p-type doped amorphous silicon portions. Each doped semiconductor material portion 133 overlies a remaining (unimplanted) portion of the support-opening semiconductor material portion 131.

In one embodiment, the dopant species can include at least one boron atom. For example, the dopant species can be selected from boron fluorides (such as $BF_3$) and boron hydrides (such as $B_2H_6$). The implantation can be performed by ion implantation with energy in a range from 1 keV to 100 keV, although lesser and greater implantation energy can also be employed. The dose of the ion implantation can be selected such that boron is present in the doped semiconductor material portions 131 at a concentration that is sufficiently high to significantly retard the etch rate of the doped semiconductor material portion 131 with respect to the undoped semiconductor material of the memory-opening semiconductor material portions 31. For example, the atomic concentration of boron in the doped semiconductor material portion can be in a range from $5.0 \times 10^{19}/cm^3$ to $5.0 \times 10^{21}/cm^3$, although lesser and greater atomic concentrations can also be employed. The depth of the ion implantation can be in a range from 5 nm to 400 nm, although lesser and greater depths can also be employed.

Support opening fill structures (131, 133) are formed by implanting the dopant species into each upper portion of the support-opening semiconductor material portions 131 while preventing implantation of the dopant species into the memory-opening semiconductor material portions 31. Each support opening fill structure (131, 133) includes a vertical stack of a doped semiconductor material portion 133 and an underlying semiconductor material portion that is a remaining portion of one of the support-opening semiconductor material portions 131. In other words, each vertical stack of a support-opening semiconductor material portion 131 and a doped semiconductor material portion 133 constitutes a support opening fill structure (131, 133). Each memory opening fill structure can consist of a respective memory-opening semiconductor material portion 31.

Referring to FIGS. 7A and 7B, the photoresist layer 47 can be removed, for example, by ashing. A second alternating stack (232, 242) of material layers is subsequently formed over the lower tier structure (132, 142, 165, 31, 131, 133). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers and the fourth material layers can be second insulating layers 232 and second sacrificial material layers 242, respectively. The third material of the second insulating layers 232 can be at least one insulating material. The fourth material of the second sacrificial material layers 242 is a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A dielectric cap layer 70 and a planarization stopping layer 72 can be subsequently formed over the second stack (232, 242). The dielectric cap layer 70 includes a dielectric material that is different from the material of the second sacrificial material layers 242. In one embodiment, the dielectric cap layer 70 can include silicon oxide. The planarization stopping layer 72 is an optional layer, and includes a dielectric material that is different from the material of the second sacrificial material layer 242 and can be employed as a planarization stopping material in a planarization process (which may be a chemical mechanical planarization process). For example, the planarization stopping layer 72 can include silicon nitride and/or a dielectric metal oxide.

Referring to FIGS. 8A and 8B, additional stepped surfaces are formed in the second stack (232, 242) in the contact region 200. The additional stepped surfaces are herein referred to as second stepped surfaces. The second stepped surfaces are formed in a second stepped area, which is adjacent to, and does not overlie, the first stepped area of the first stepped surfaces within the lower tier structure (132, 142, 165, 31, 131, 133). The second stepped surfaces can be adjacent to, and do not overlie, the stepped interface between the first alternating stack (132, 146) and the first retro-stepped dielectric material portion 165.

The second stepped surfaces can be formed, for example, by forming a mask layer with an opening therein, etching a cavity within the levels of the topmost second sacrificial material layer 242 and the topmost second insulating layer 232, and iteratively expanding the etched area and vertically recessing the cavity by etching a pair of a second insulating layer 232 and a second sacrificial material layer 242 located directly underneath the bottom surface of the etched cavity within the etched area. The second stack (232, 242) is patterned such that each underlying second sacrificial material layer 242 laterally protrudes farther than any overlying second sacrificial material layer 242 in the etched region, and each underlying second insulating layer 232 laterally protrudes farther than any overlying second insulating layer 232 in the etched region. Thus, within the area of the second stepped terraces, each spacer material layer (such as the second sacrificial dielectric layer 242) laterally extends farther than any overlying spacer material layer within the first alternating stack (232, 242). The etched area includes the area of the contact region 200, which includes the contact area for the second stack (232, 242) and a contact area for the first alternating stack (132, 142).

Thus, the second stack (232, 242) is patterned to form the second stepped surfaces thereupon. The cavity formed by removal of portions of the second stack (232, 242) is herein referred to as a second stepped cavity. The area of the second stepped cavity includes the area of the first retro-stepped first dielectric material portion 165, from which all layers of the second stack (232, 242) are removed. The area of the second stepped cavity further includes the area of the second stepped surfaces of the second stack (232, 242).

A dielectric material is deposited to fill the second stepped cavity. Excess portions of the dielectric material overlying the topmost surface of the second stack (232, 242) are removed, for example, by chemical mechanical planarization. The remaining portion of the deposited dielectric material is retro-stepped, and thus, forms a second retro-stepped dielectric material portion 265. The second retro-stepped dielectric material portion 265 is located on, and over, the second stepped surfaces of the second stack (232, 242). The second retro-stepped dielectric material portion 265 is formed on the second stepped surfaces. The contact region 200 comprises a region of the first stepped surfaces and a region of the second stepped surfaces.

Referring to FIGS. 9A and 9B, second openings (141, 341) are formed through the upper tier structure (232, 242, 265, 70, 72) and to the top surface of the lower tier structure (132, 142, 165, 11, 111, 131, 133). The second openings (141, 341) include second memory openings 141 that are formed in the memory array region 100 and second support openings 341 that are formed in the contact region 200. The second memory openings 141 are herein referred to as upper tier memory openings, and the second support openings 341 are herein referred to as upper tier support openings. Each second memory opening 141 can be formed in an area that substantially coincides with the area of a respective first memory opening 121, which is substantially the same as a respective memory-opening semiconductor material portion 31. Each second support opening 341 can be formed in an area that substantially coincides with the area of a respective first support opening 321, which is substantially the same as a respective support opening fill structure (131, 133).

For example, a lithographic material stack (not shown) including at least a photoresist layer can be formed over the upper tier structure (232, 242, 265, 70, 72), and can be lithographically patterned to form openings within the lithographic material stack. The pattern in the lithographic material stack can be transferred through the entirety of the upper tier structure (232, 242, 265, 70, 72) by at least one anisotropic etch that employs the patterned lithographic material stack as an etch mask. Portions of the upper tier structure (232, 242, 265, 70, 72) underlying the openings in the patterned lithographic material stack are etched to form the second openings (141, 341). In other words, the transfer of the pattern in the patterned lithographic material stack through the upper tier structure (232, 242, 265, 70, 72) forms the second openings (141, 341).

In one embodiment, the chemistry of the anisotropic etch process employed to etch through the materials of the second stack (232, 242) can alternate to optimize etching of the third and fourth materials in the second stack (232, 242) while providing a comparable average etch rate for the second dielectric material portion 265. The anisotropic etch can be, for example, a series of reactive ion etches. The sidewalls of the second openings (141, 341) can be substantially vertical, or can be tapered.

Due to the compositional changes at the interface between the second retro-stepped dielectric material portion 265 and the second sacrificial material layers 242 contacting horizontal bottom surfaces of the second retro-stepped dielectric material portion 265, surface damage can be introduced around the second support openings 341 on the top surfaces of the second sacrificial material layers 242 that contact the second retro-stepped dielectric material portion 265. In addition, a stepwise narrowing of the second support openings 341 may be present at the interface between the second retro-stepped dielectric material portions 265 and the underlying second sacrificial material layers 142.

The second memory openings (141, 341) are formed through the upper tier structure (232, 242, 265, 70, 72) in areas overlying the first memory openings (121, 321), which are filled with the sacrificial opening fill structures 31 and (131, 133). The second support opening 341 can be formed through the second stack of alternating layers (232, 242) and through the second dielectric material portion 265 concurrently with formation of the second memory openings 141, which are formed through the second stack of alternating layers (232, 242). In one embodiment, the memory opening fill structures (i.e., the memory-opening semiconductor material portions 31) and the support opening fill structures (131, 133) can be employed as an endpoint detection layer to control the termination time of the anisotropic etch process.

The lateral dimensions (e.g., a diameter) of the second openings (141, 341) can be comparable to the lateral dimensions of the first openings (121, 321). For example, the lateral dimensions of the second openings (141, 341) can be from about 20 nm to 200 nm at an upper portion of each second opening (141, 341), and can be about 10 nm to 150 nm at a lower portion of each second opening (141, 341). In one embodiment, the second memory openings 141 and the first memory openings 121 can be formed as an array of openings, which can be a periodic two-dimensional array of openings. The second support openings 341 and the first support openings 321 may or may not form a periodic two-dimensional array pattern. The lateral separation distance among the second support openings 341 may be greater than twice (e.g., three time or more) the nearest neighbor distance among the second memory openings 141.

Each bottom surface of the second memory openings 141 can be entirely within the area of a top surface of an underlying memory-opening semiconductor material portion 31. Each bottom surface of the second support openings 341 can be entirely within the area of a top surface of an underlying support opening fill structure (131, 133). Subsequently, the patterned lithographic material stack can be subsequently removed, for example, by ashing.

Figure 10A:
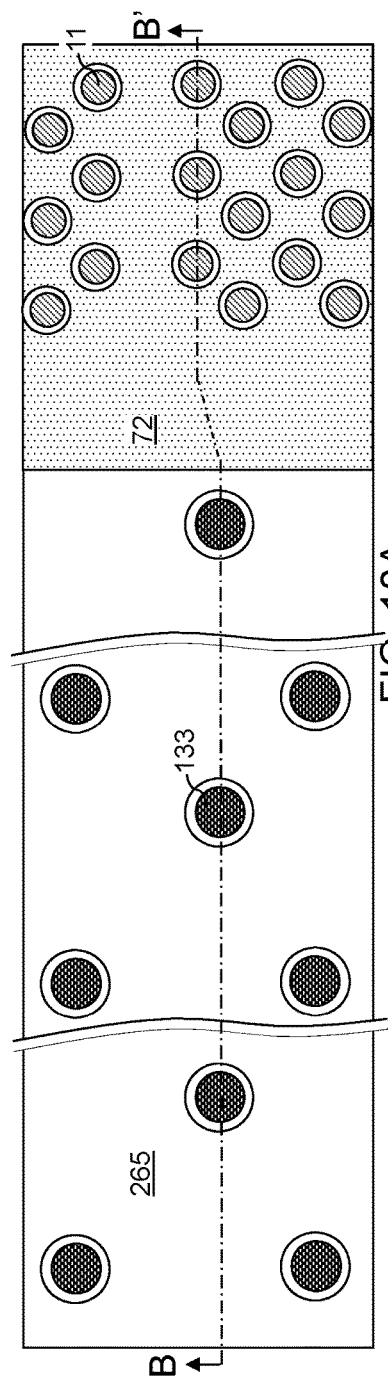
FIG. 10A is a top-down view of the exemplary structure after formation of inter-stack memory openings in the device region according to an embodiment of the present disclosure.
Figure 10B:
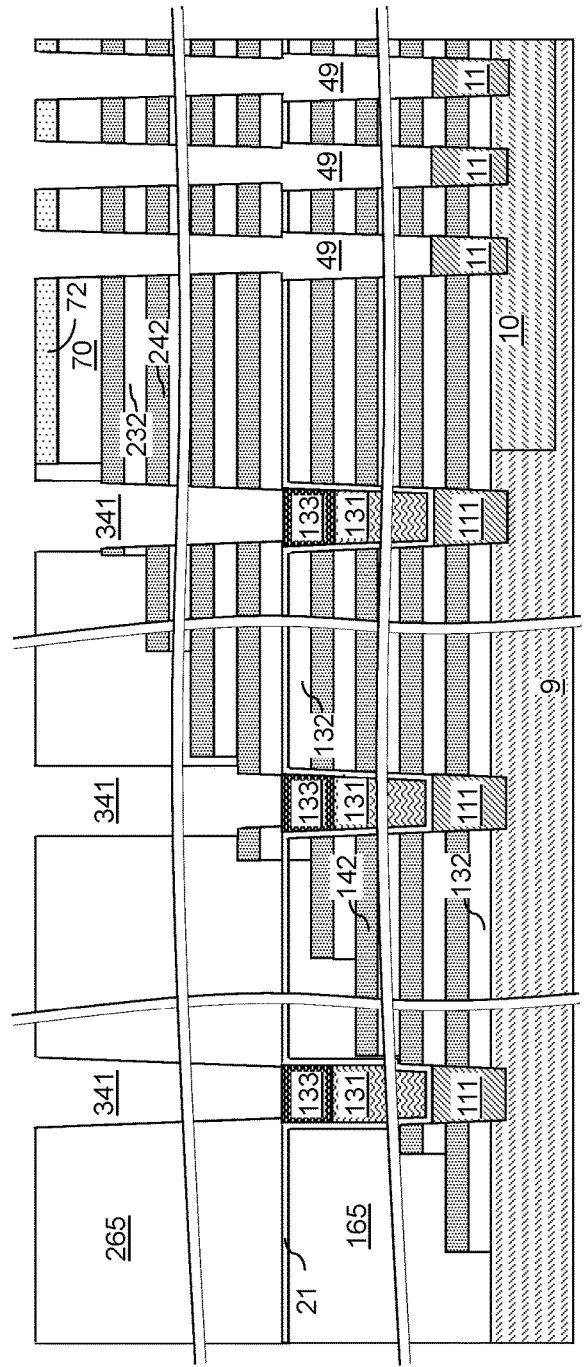
FIG. 10B is a vertical cross-sectional view of the exemplary structure of FIG. 10A along the vertical plane B-B'.

Referring to FIGS. 10A and 10B, an etchant that etches the semiconductor material of the memory-opening semiconductor material portions 31 selective to the doped semiconductor material portions 133 in the support opening fill structures (131, 133) is applied to the second memory openings 141 and the second support openings 341. For example, the exemplary structure can be immersed in a wet etch tank that includes a liquid etchant that etches the semiconductor material of the memory-opening semiconductor material portions 31 selective to the doped semiconductor material portions 133 in the support opening fill structures (131, 133) is applied to the second memory openings 141 and the second support openings 341.

The sacrificial semiconductor material of the memory-opening semiconductor material portions 31 is removed from within the first memory openings 121 to form inter-stack memory openings 49 that extend through the lower tier structure (132, 142, 165, 11, 111, 131, 133) and the upper tier structure (232, 242, 265). A selective etch process that removes the sacrificial semiconductor material of the memory-opening semiconductor material portions 31 without etching the entirety of the doped semiconductor material portions 133 can be employed. In one embodiment, the etchant can be selected such that the etch rate of the semiconductor material of the memory-opening semiconductor material portions 31 is greater than the etch rate of the doped semiconductor material of the doped semiconductor material portions 133 by a factor greater than the ratio of the height of the memory-opening semiconductor material portions 31 to the height of the doped semiconductor material portions 133. In other words, the selectivity of the etch process can be greater than the ratio of the height of the memory-opening semiconductor material portions 31 to the height of the doped semiconductor material portions 133. In one embodiment, the selectivity of the etch process can be greater than 3. In one embodiment, the selectivity of the etch process can be greater than 6, and may be greater than 10.

In an illustrative example, the memory-opening semiconductor material portions 31 can include undoped amorphous silicon or undoped polysilicon, the doped semiconductor material portions 133 can include boron-doped amorphous silicon or boron-doped polysilicon, and the etchant can include trimethyl-2-hydroxyethyl ammonium hydroxide (TMY), which can provide etch selectivity greater than 3 (and preferably greater than 6 and/or 10) between the boron-doped silicon and undoped silicon. Trimethyl-2-hydroxyethyl ammonium hydroxide as an etchant can be employed in a wet etch process to remove the entirety of each memory-opening semiconductor material portion 31, while not removing or at least not completely removing each of the doped semiconductor material portion 133.

In case the memory-opening semiconductor material portions 31 are formed by a non-conformal deposition process, a cavity may be formed within each memory-opening semiconductor material portion 31. In this case, etching of the memory-opening semiconductor material portions 31 can be accelerated by employing the cavities to enable lateral etching of the material of the memory-opening semiconductor material portions 31. Thus, an etch chemistry with a lesser selectivity may be employed to remove the memory-opening semiconductor material portions 31 without completely removing the doped semiconductor material portions 133 than the ratio of the ratio of the height of the memory-opening semiconductor material portions 31 to the height of the doped semiconductor material portions 133. The selective etch process can be an isotropic etch process or an anisotropic etch process.

Specifically, the sacrificial semiconductor material of the memory-opening semiconductor material portions 31 is removed from underneath the second memory openings 321 to form inter-stack memory openings 49. Each inter-stack memory opening 49 includes a volume of a vertically adjoining pair of a first memory opening 121 and a second memory opening 141, and extends at least between a first horizontal plane including a bottom surface of the lower tier structure (132, 142, 165, 11, 111, 131, 133) to a top surface of the upper tier structure (232, 242, 265). After removal of the memory-opening semiconductor material portions 31, a support opening fill structure (131, 133) is present within each of the first support openings 321. Each support opening fill structure (131, 133) includes a vertical stack of a doped semiconductor material portion 133 and a support-opening semiconductor material portion 131. Each support-opening semiconductor material portion 131 can include an undoped semiconductor material that is substantially free of electrical dopants (such as p-type dopants or n-type dopants).

Subsequently, an optional isotropic etch can be performed to remove physically exposed portions of the optional etch stop layer 21 from the periphery of the inter-stack memory openings 49, i.e., from the periphery of the portions of the inter-stack memory openings 49 within the lower stack structure (131, 142, 165, 11, 111, 131, 133). Thus, sidewalls of the first and second insulating layers (132, 232) and the first and second sacrificial material layers (142, 242) and the top surfaces of the first epitaxial semiconductor portions 11 are physically exposed in the inter-tier memory openings 49. Alternatively, if the etch stop layer 21 functions as a blocking dielectric of the device, then it may be retained in the device.

Thus, the memory opening fill structures (as embodied as the memory-opening semiconductor material portions 31) can be removed selective to the support opening fill structures (131, 133). The inter-stack memory openings 49 include volumes from which the memory opening fill structures are removed.

Figure 11A:
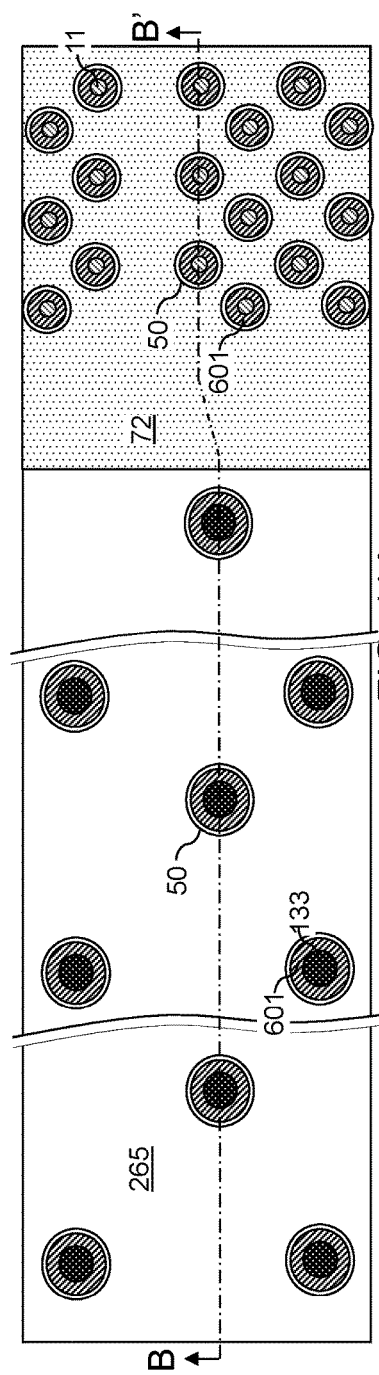
FIG. 11A is a top-down view of the exemplary structure after simultaneous formation of memory films and first vertical semiconductor material layer according to an embodiment of the present disclosure.
Figure 11B:
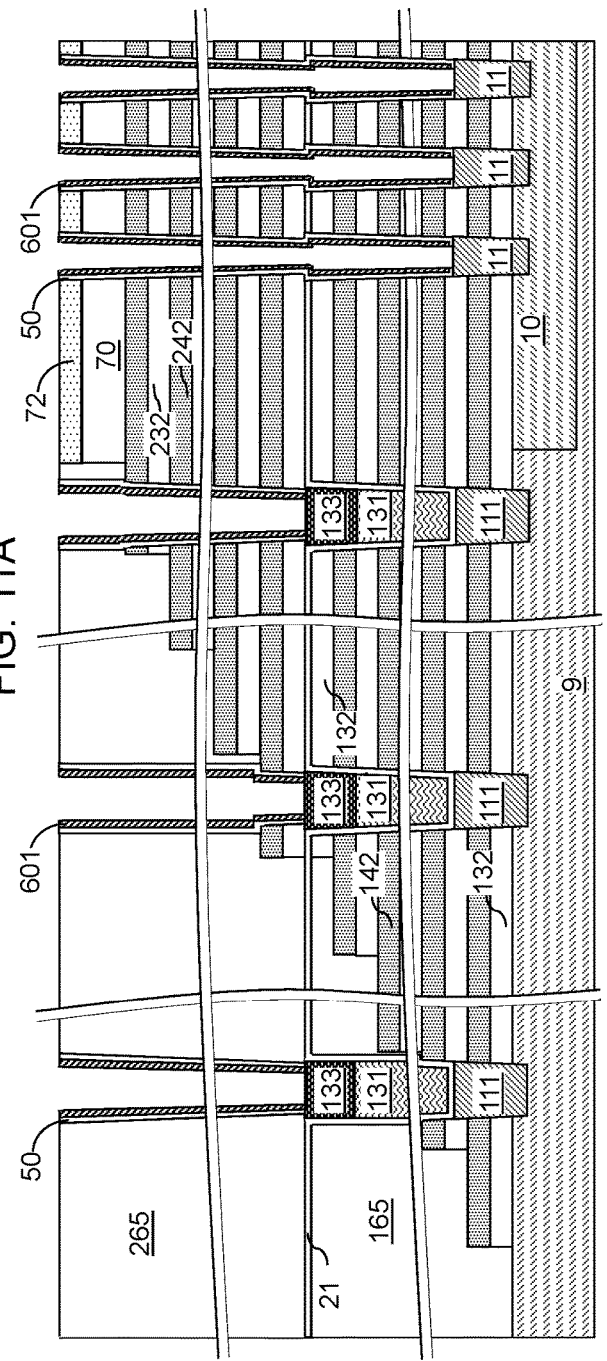
FIG. 11B is a vertical cross-sectional view of the exemplary structure of FIG. 11 along the vertical plane B-B'.

Referring to FIGS. 11A and 11B, a stack of a memory film 50 and a first semiconductor channel layer 601 can be formed in each of the inter-tier memory openings 49 and the second support openings 341. Each stack of a memory film 50 and a first semiconductor channel layer 601 can be formed, for example, by sequentially depositing a blocking dielectric layer, a charge storage material layer, a tunneling dielectric layer, and a semiconductor material layer, and anisotropically etching horizontal portions of the deposited material layers. The stack of the blocking dielectric layer, the charge storage material layer, and the tunneling dielectric layer collectively constitutes a memory film 50.

The blocking dielectric layer includes a dielectric material that blocks flow of charge carriers therethrough, and can include a material such as aluminum oxide, silicon oxide, or a combination thereof. Alternatively, formation of the blocking dielectric may be omitted at this point if the etch stop layer 21 functions as the blocking dielectric or if the blocking dielectric is formed through the back side recesses as will be described below. The charge storage material layer includes charge storage material portions that function as memory elements, and is formed directly on the blocking dielectric layer.

In one embodiment, the charge storage material layer can include a charge trapping material such as silicon nitride. Alternatively, the charge storage material layers can be replaced with floating gate electrodes if recessing of the spacer material layers (142, 242) is performed prior to formation of the blocking dielectric layer, and if a conductive material is deposited within recessed regions and vertically isolated. The tunneling dielectric layer includes a tunneling dielectric such as an ONO stack.

The first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed.

A cavity can be present within each inter-stack memory opening 49 and within each second support opening 341 after formation of the first semiconductor channel layers 601. An anisotropic etch is performed to remove horizontal portions of the first semiconductor channel layer 601 and each memory film 50, and to physically expose in the openings 49 a surface of each epitaxial semiconductor portion 11 (or the semiconductor substrate (9, 10) in case the epitaxial semiconductor portions (11, 111) are omitted).

Figure 12A:
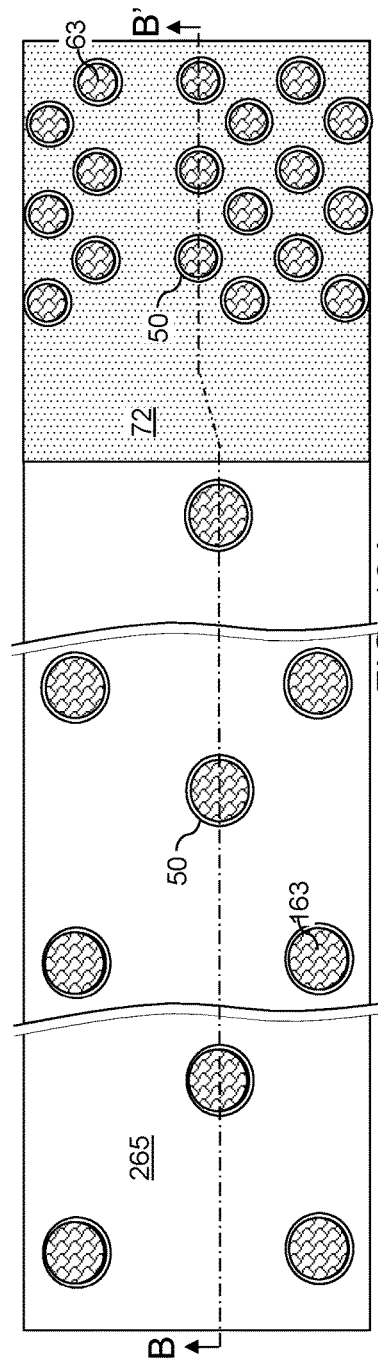
FIG. 12A is a top-down view of the exemplary structure after simultaneous formation of memory stack structures and drain regions in the device region and support pillar structures and dummy drain regions in the stepped surface region according to an embodiment of the present disclosure.
Figure 12B:
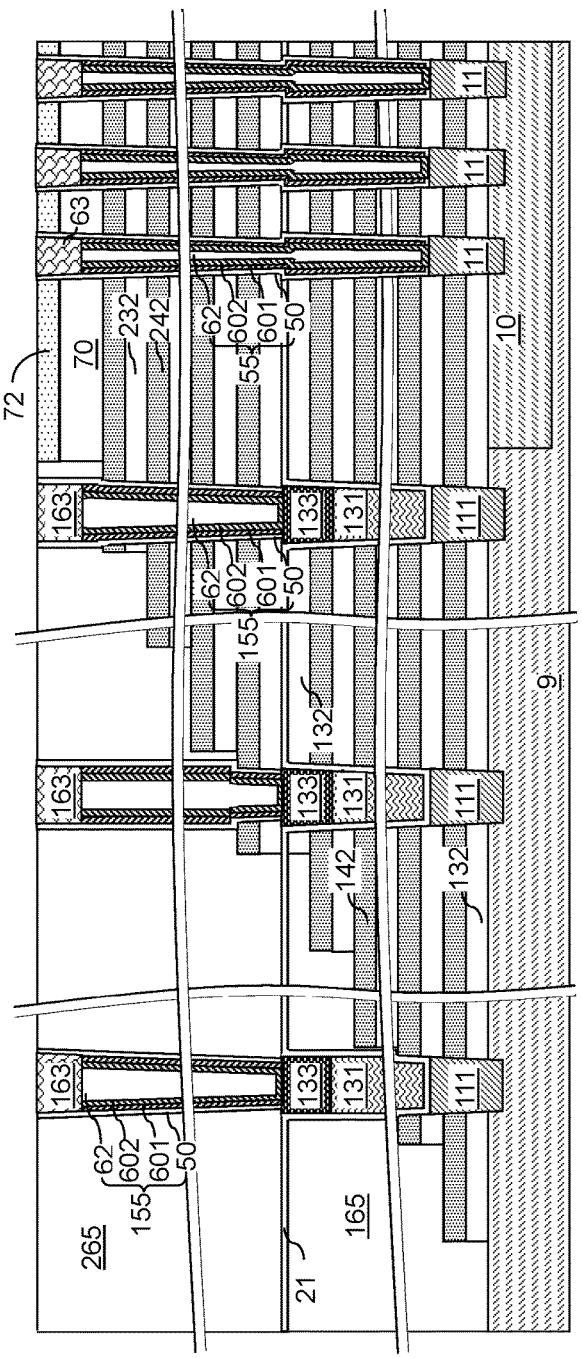
FIG. 12B is a vertical cross-sectional view of the exemplary structure of FIG. 12A along the vertical plane B-B'.

Referring to FIGS. 12A and 12B, a second semiconductor channel layer 602 can be deposited on remaining vertical portions of the first semiconductor channel layer 601 and on the physically exposed surfaces of the epitaxial semiconductor portions 11 and on regions 133 exposed in openings 341. The second semiconductor channel layer 602 includes a semiconductor material, which can be any semiconductor material that can be employed for the first semiconductor channel layer 601. The first and second semiconductor channel layers (601, 602) collectively constitute a vertical semiconductor material layer (601, 602), and can have a doping of the first conductivity type (i.e., the same conductivity type as the semiconductor substrate (9, 10)) or can be substantially intrinsic. In one embodiment, the second semiconductor channel layer 602 can include amorphous silicon or polysilicon. The thickness of the second semiconductor channel layer 602 can be in a range from 2 nm to 10 nm, although lesser and greater thicknesses can also be employed.

In case the cavities in the inter-tier memory openings 49 and the second support openings 341 are not completely filled with the semiconductor channel layers (601, 602), a dielectric core layer can be deposited in the cavities. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Subsequently, the horizontal portion of the dielectric core layer can be removed, for example, by a recess etch from above the top surface of the insulating cap layer 70 and the optional planarization stopping layer 72. For example, the horizontal portion of the second semiconductor channel layer 602 located above the top surface of the planarization stopping layer 72 can be removed by a planarization process, which can employ a recess etch or chemical mechanical planarization (CMP). Each remaining portion of the first and second semiconductor channel layers (601, 602) within the inter-tier memory openings 49 and the second support openings 341 constitutes a semiconductor channel (601, 602), which is a vertical portion of a composite semiconductor channel that further includes a horizontal semiconductor channel that is present between the epitaxial semiconductor portions (11, 111) and the source regions 61 to be formed in an upper portion of the semiconductor substrate (9, 10).

Electrical current can flow through the semiconductor channel (601, 602) when a vertical NAND device including the semiconductor channel (601, 602) is turned on. A tunneling dielectric is laterally surrounded by a charge storage material layer, and laterally surrounds a portion of the semiconductor channel (601, 602). Each memory film 50 can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer can be further recessed within each inter-stack memory opening 49 and within each second support opening 341, for example, by a recess etch to a depth that is located between the top surface of the insulating cap layer 70 and the bottom surface of the insulating cap layer 70. Each remaining portion of the dielectric core layer constitutes a dielectric core 62.

A doped semiconductor material can be deposited in each recessed region over the dielectric cores 62. The doped semiconductor material can be, for example, doped polysilicon. Excess portions of the deposited semiconductor material can be removed from above the top surface of the planarization stopping layer 72, for example, by chemical mechanical planarization (CMP) or a recess etch to form the drain region 63. A drain region 63 can be formed by depositing a doped semiconductor material within each recessed region above the dielectric cores 62 in the inter-stack memory openings 49. Concurrently with formation of the drain regions 62, a dummy drain region 163 can be formed by depositing a doped semiconductor material within each recessed region above the dielectric cores 62 in the second support openings 341.

A memory stack structure 55 is formed within each inter-stack memory opening 49. A support pillar structure 155 is formed within each second support opening 341. Each of the memory stack structures 55 and the support pillar structures 155 includes a memory film 50, a vertical semiconductor channel (601, 602), and a dielectric core 62. A drain region 63, which is subsequently electrically contacted by a drain contact via structure, overlies each memory stack structure 55. A dummy drain region 163, which is not electrically contacted by any conductive via structure, overlies each support pillar structure 155.

Each of the memory stack structures 55 and the support pillar structures 155 comprises a respective instance of a layer stack including charge storage material portions (which may be embodied as a continuous charge storage material layer or discrete floating gate structures), a tunneling dielectric, and at least one vertical semiconductor material layer (such as the semiconductor channel (601, 602)). In one embodiment, the charge storage material portions can include a charge trapping material such as silicon nitride. The tunneling dielectric laterally surrounds the at least one vertical semiconductor material layer. At least one of the support pillar structures 155 can vertically extend through the retro-stepped dielectric material portions (165, 265) and the stepped terraces therebelow. Thus, each of the memory stack structures 55 can be vertically spaced from the semiconductor substrate (9, 10) by a respective epitaxial semiconductor portion 11.

Thus, memory stack structures 55 are formed in the inter-stack memory openings 49 and support pillar structures 155 are formed in the second memory openings 341 (i.e., the upper tier support openings). Bottommost surfaces of the memory stack structures 55 can be formed below a horizontal plane including bottommost surfaces of the support stack structures 155. In one embodiment, the bottommost surfaces of the memory stack structures 55 can be located within a horizontal plane between the top surface of the bottommost first sacrificial material layer 142 and the second-from-the-bottom first sacrificial material layer 142. The bottommost surfaces of the support pillar structures 155 can be located within a horizontal plane at, or below a horizontal plane including the bottom surface of the bottommost second insulating layer 232 and above a horizontal plane including the bottom surface of the topmost first sacrificial material layer 142.

Figure 13A:
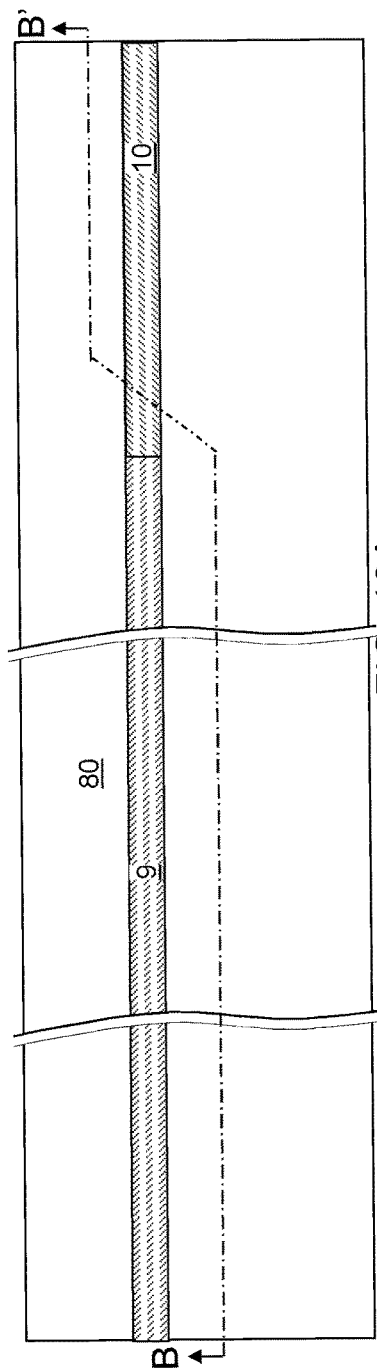
FIG. 13A is a top-down view of the exemplary structure after formation of a backside contact trench according to an embodiment of the present disclosure.
Figure 13B:
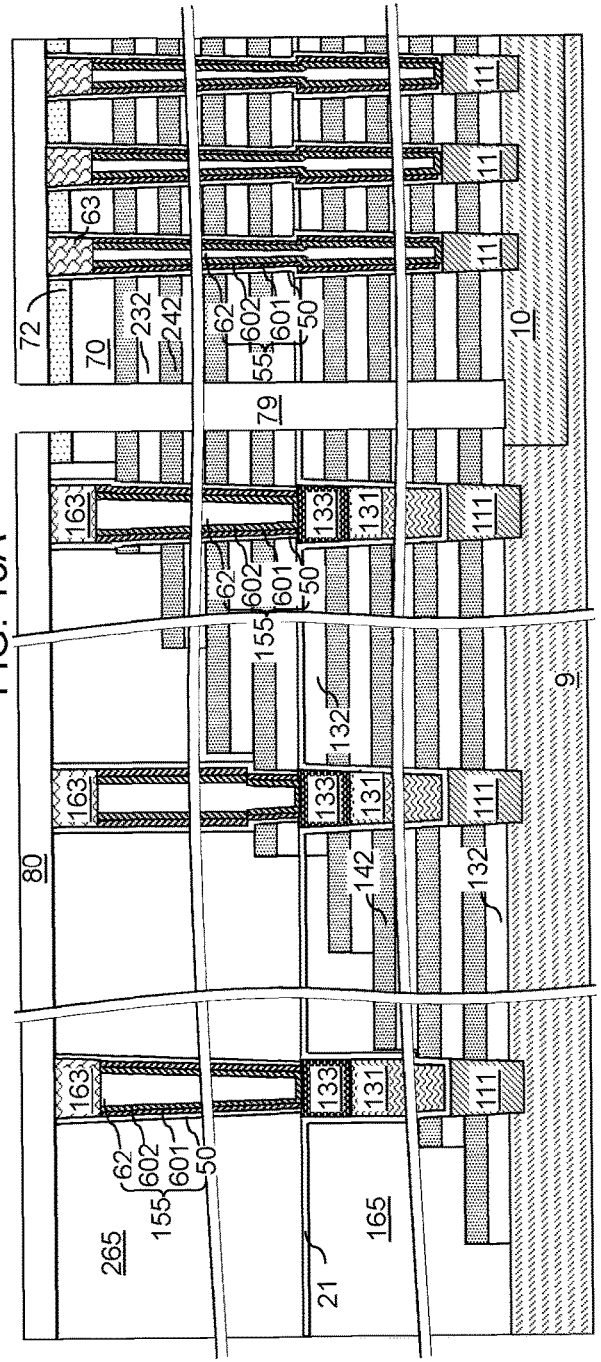
FIG. 13B is a vertical cross-sectional view of the exemplary structure of FIG. 13A along the vertical plane B-B'.

Referring to FIGS. 13A and 13B, a contact level dielectric layer 80 can be optionally deposited over the upper tier structure (232, 242, 265, 70, 72). The contact level dielectric layer 80 includes a dielectric material that is different from the material of the second sacrificial semiconductor material layers 242. For example, the contact level dielectric layer 80 can include silicon oxide. The thickness of the contact level dielectric layer 80 can be in a range from 20 nm to 500 nm, although lesser and greater thicknesses can also be employed.

At least one contact trench 79 can be formed, for example, by applying a photoresist layer (not shown), lithographically patterning the photoresist layer, and transferring the pattern in the photoresist layer through the upper tier structure (232, 242, 265, 70, 72, 155) and the lower tier structure (132, 142, 165, 11, 111, 131, 133) employing an anisotropic etch. Each contact trench 79 is located in areas that do not overlap with the memory stack structures 55, and this, is referred to as a backside contact trench. The anisotropic etch that forms the at least one contact trench 79 can stop on the semiconductor substrate (9, 10).

Figure 14A:
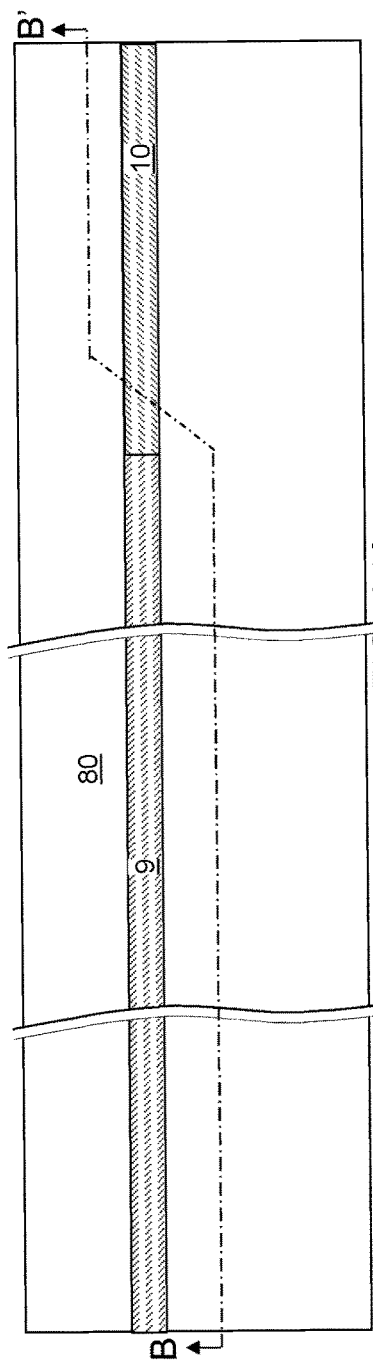
FIG. 14A is a top-down view of the exemplary structure after formation of backside recesses according to an embodiment of the present disclosure.
Figure 14B:
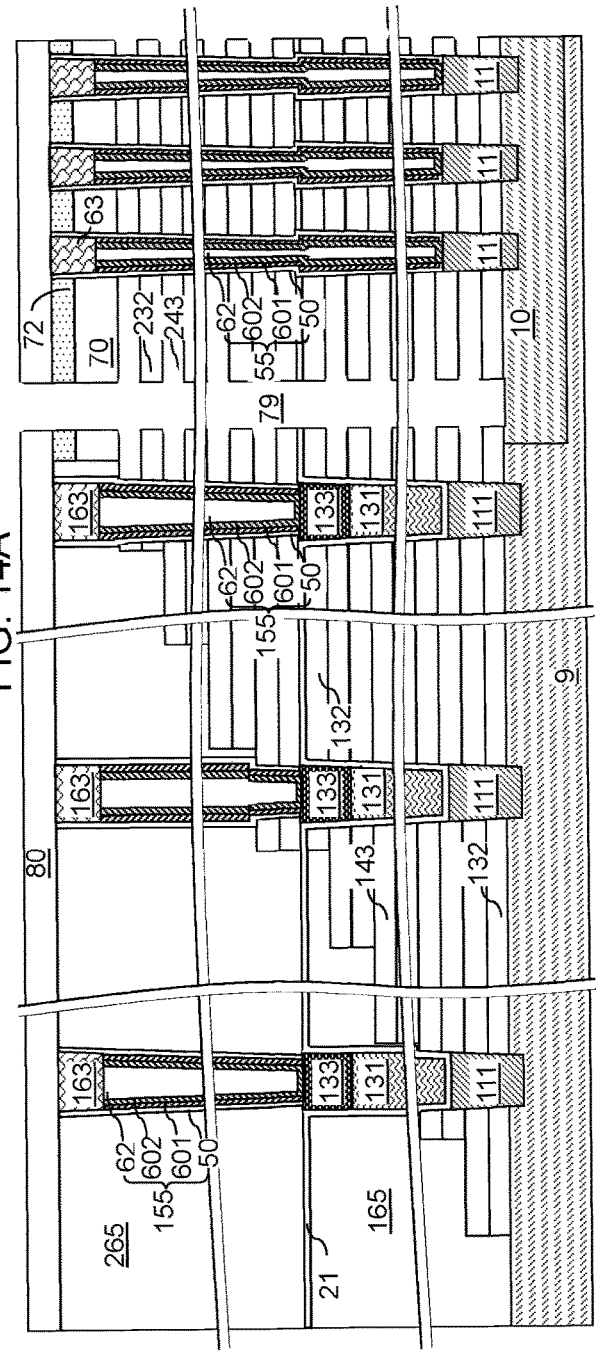
FIG. 14B is a vertical cross-sectional view of the exemplary structure of FIG. 14A along the vertical plane B-B'.

Referring to FIGS. 14A and 14B, an etchant that selectively etches the materials of the first and second sacrificial material layers (142, 242) with respect to the materials of the first and second insulating layers (132, 232) can be introduced into the contact trench 79, for example, employing an isotropic etch process. First backside recesses 143 are formed in volumes from which the first material layers 142 are removed, and second backside recesses 243 are formed in volumes from which the second sacrificial material layers 242 are removed. The removal of the materials of the first and second sacrificial material layers (142, 242) can be selective to the materials of the first and second insulating layers (132, 232), the materials of the first and second retro-stepped dielectric material portions (165, 265), and the material of the outermost layer of the memory film 50 (which may be a blocking dielectric layer). In one embodiment, the first and second sacrificial material layers (142, 242) can include silicon nitride, and the materials of the first and second insulating layers (132, 232), and the first and second retro-stepped dielectric material portion (165, 265) can be selected from silicon oxide and dielectric metal oxides. In another embodiment, the first and second sacrificial material layers (142, 242) can include a semiconductor material such as germanium or a silicon-germanium alloy, and the materials of the first and second insulating layers (132, 232) and the first and second retro-stepped dielectric material portions (165, 265) can be selected from silicon oxide, silicon nitride, and dielectric metal oxides.

The isotropic etch process can be a wet etch process employing a wet etch solution, or can be a gas phase (dry) etch process in which the etchant is introduced in a vapor phase into the contact trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each backside recess (143, 243) can be a laterally extending cavity having a lateral dimension that is greater than the vertical extent of the cavity. In other words, the lateral dimension of each backside recess (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the plurality of backside recesses (143, 243) can extend substantially parallel to the top surface of the substrate (9, 10). A first backside recess 143 can be vertically bounded by a top surface of an underlying first insulating layer 132 and a bottom surface of an overlying first insulating layer 132. A second backside recess 243 can be vertically bounded by a top surface of an underlying second insulating layer 232 and a bottom surface of an overlying second insulating layer 232. Each backside recess (143, 243) can have a uniform height throughout, or may have a height variation induced by process non-uniformity.

Figure 15A:
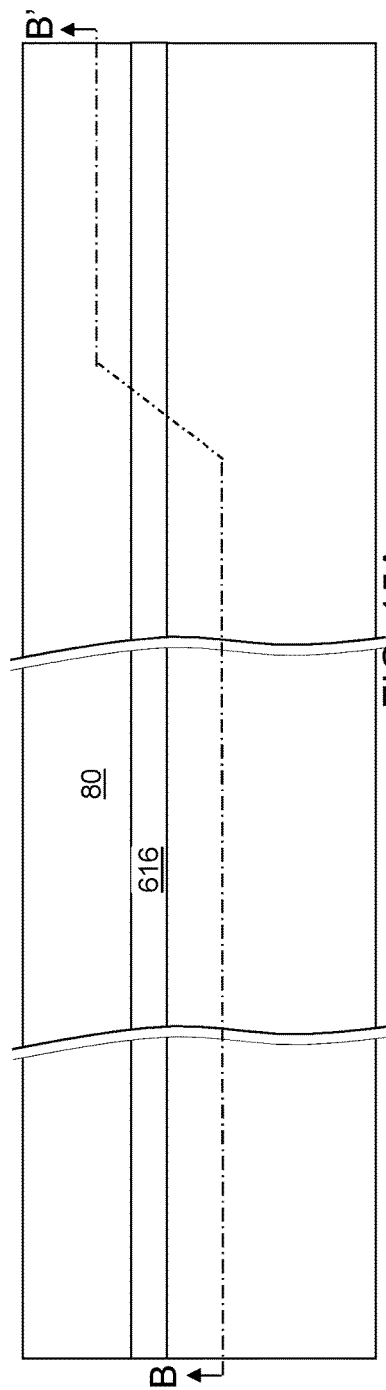
FIG. 15A is a top-down view of the exemplary structure after formation of annular dielectric spacers and sacrificial semiconductor oxide portion according to an embodiment of the present disclosure.
Figure 15B:
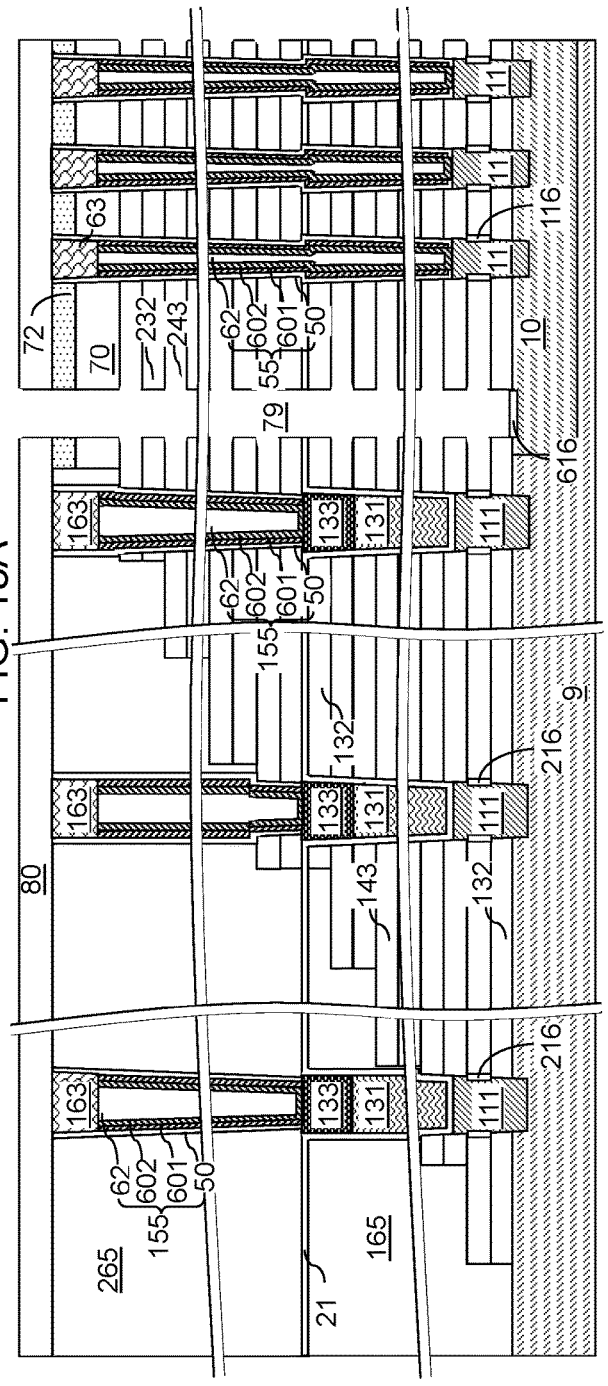
FIG. 15B is a vertical cross-sectional view of the exemplary structure of FIG. 15A along the vertical plane B-B'.

Referring to FIGS. 15A and 15B, an oxidation process can be performed to convert surface portions of physically exposed semiconductor materials into semiconductor oxide portions. For example, physically exposed surface portions of the epitaxial semiconductor portions (11, 111) can be converted into annular semiconductor oxide spacers (116, 216). The annular semiconductor oxide spacers (116, 216) can include first annular semiconductor oxide spacers 116 that are formed around each first epitaxial semiconductor portion 11, and second annular semiconductor oxide spacers 216 that are formed around each second epitaxial semiconductor portion 111. A physically exposed surface portion of the semiconductor substrate (9, 10) (such as the surface portion of the doped semiconductor well 10 underlying the contact trench 79) can be converted into semiconductor oxide portions 616.

Referring to FIGS. 16A and 16B, an optional backside blocking dielectric layer 502 can be deposited in the first and second backside recesses (143, 242), on the sidewalls of the contact trench 79, and over the contact level dielectric layer 80 as a continuous dielectric material layer. The backside blocking dielectric layer 502 can include a dielectric material such as aluminum oxide, silicon oxide, or a combination thereof.

At least one conductive material can be deposited in the plurality of backside recesses (143, 243), on the sidewalls of the contact trench 79, and over the contact level dielectric layer 80. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a contiguous metallic material layer (not shown) can be formed on the sidewalls of each contact trench 79 and over the contact level dielectric layer 80. A backside cavity is present in the portion of each contact trench 79 that is not filled with the contiguous metallic material layer. The deposited metallic material of the contiguous metallic material layer can be etched back from the sidewalls of each contact trench 79 and from above the contact level dielectric layer 80, for example, by an isotropic etch.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses (143, 243) include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses (143, 243) can be a combination of titanium nitride layer and a tungsten fill material. In one embodiment, the metallic material can be deposited by chemical vapor deposition or atomic layer deposition.

Thus, each first sacrificial material layer 142 can be replaced with a first electrically conductive layer 146, and each second sacrificial material layer 242 can be replaced with a second electrically conductive layer 246. Each electrically conductive layer (146, 246) can function as a combination of a plurality of control gate electrodes located at a same level and a word line electrically interconnecting, i.e., electrically shorting, the plurality of control gate electrodes located at the same level.

Referring to FIGS. 17A and 17B, an insulating spacer 74 is formed within each backside contact trench 79 by a conformal deposition of a dielectric material layer and an anisotropic etch that removes the horizontal portions of the dielectric material layer. A source region 61 may be formed in the substrate (9, 10) by implanting dopants of the same conductivity type as used the drain regions 63 into the substrate through the trench 79 before or after formation of the spacer 74. At least one conductive material is deposited within the cavity enclosed by the insulating spacer 74, and excess portion of the at least one conductive material is removed from above a horizontal plane including a top surface of the contact level dielectric layer 80. A remaining portion of the at least one conductive material within the insulating spacer 74 constitutes a backside contact via structure 76.

Figure 18A:
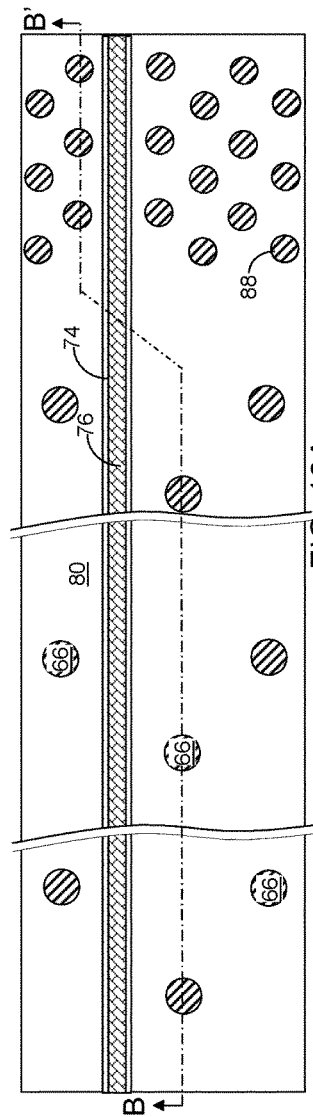
FIG. 18A is a top-down view of the exemplary structure after formation of various contact via structures according to an embodiment of the present disclosure.
Figure 18B:
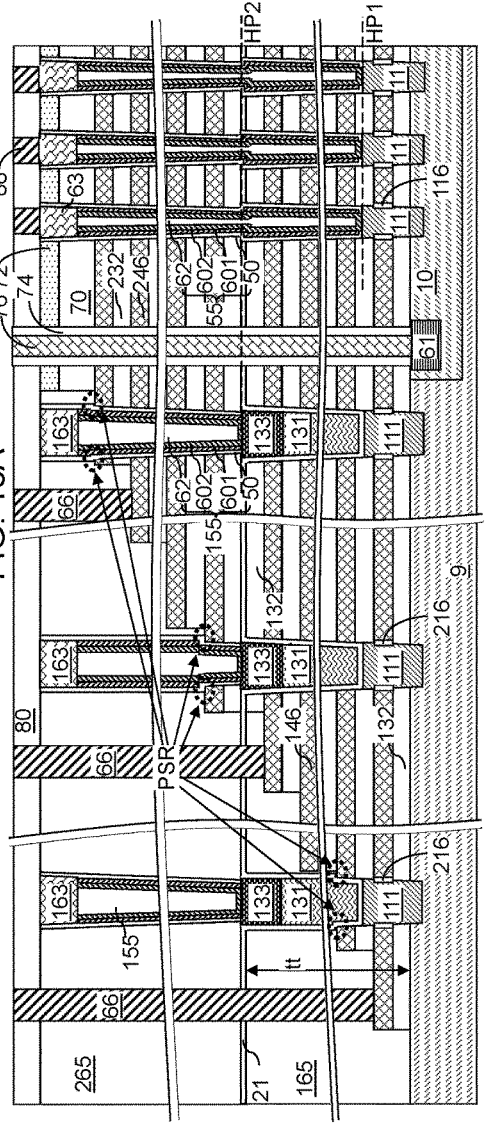
FIG. 18B is a vertical cross-sectional view of the exemplary structure of FIG. 18A along the vertical plane B-B'.

Referring to FIGS. 18A and 18B, control gate contact via structures 66 can be formed through the contact level dielectric layer 80 and the second and/or first retro-stepped dielectric material portions (165, 265) to provide electrical contact to the first and second electrically conductive layers (146, 246). Drain contact via structures 88 extending through the contact level dielectric layer 80 can be formed on the drain regions 63, while not forming any contact via structure directly on the dummy drain regions. 163. Each drain region 63 is contacted by an overlying drain contact via structure 88, while the contact level dielectric layer 80 contacts an entire top surface of each of the dummy drain regions 163.

While a method employing two tier structures are illustrated and described above, it should be understood that more than two tier structures, such as three to ten tier structures, such as four to six tier structures, may be formed using the above described method. If more than two tier structures are employed, the doped semiconductor material portions 133 can be formed in an upper portion of any of the tier structures other than the topmost tier structure.

The exemplary structure of the present disclosure can include a monolithic three-dimensional memory device comprising: a lower tier structure (132, 146, 165, 11, 111, 131, 133) comprising a first alternating stack of first insulating layers 132 and first electrically conductive layers 146 and located over a substrate (9, 10); an upper tier structure (232, 246, 265, 70, 72) comprising a second alternating stack of second insulating layers 232 and second electrically conductive layers 246 and located over the lower tier structure (132, 146, 165, 11, 111, 131, 133); and memory stack structures 55 extending through the second alternating stack and at least an upper portion of the first alternating stack and support pillar structures 155 extending through the second alternating stack. Each of the memory stack structures 55 and support pillar structures 155 comprises a respective vertical semiconductor material layer (601, 602); and each vertical semiconductor material layer (601, 602) in the support pillar structures 155 has a bottommost surface located above a horizontal plane including bottommost surfaces of vertical semiconductor material layers (601, 602) within the memory stack structures 55.

In one embodiment, the device further comprises doped semiconductor material portions 133 and intrinsic semiconductor material portions 131 (i.e., the support-opening semiconductor material portions 131). Each of the support pillar structures 155 overlies a one of the doped semiconductor material portions 133 in contact with a bottom surface of a respective vertical semiconductor material layer (601, 602), and each of the doped semiconductor material portions 133 overlies one of the intrinsic semiconductor material portions 131. In one embodiment, the device further includes a dielectric etch stop layer 21 which can include a first horizontal portion located between the first alternating stack (132, 146) and the second alternating stack (232, 246), a second horizontal portion located between the intrinsic semiconductor material portions 131 and the substrate (9, 10), and vertical portions laterally surrounding respective doped semiconductor material portions.

The monolithic three-dimensional memory device can further include first epitaxial semiconductor portions 11 underlying respective memory stack structures 55; and second epitaxial semiconductor portions 111 underlying the support pillar structures 155. The second horizontal portion of the etch stop layer 21 is located between the intrinsic semiconductor material portions 31 and the second epitaxial semiconductor portions 111. Each of the first and second epitaxial semiconductor portions (11, 111) can include a respective single crystalline semiconductor material that is epitaxially aligned to a single crystalline semiconductor material of the substrate (9, 10). In one embodiment, each doped semiconductor material portion 133 can overlie a respective semiconductor material portion (i.e., a support-opening semiconductor material portion) 131 located above the substrate (9, 10); and each doped semiconductor material portion 133 can differ in composition from a respective underlying semiconductor material portion by presence of a dopant species such as boron. In one embodiment, the semiconductor material portions 131 can comprise substantially intrinsic polysilicon or amorphous silicon, the intrinsic semiconductor material portions 131 comprise undoped polysilicon or undoped amorphous silicon, and the doped semiconductor material portions 133 can comprise boron-doped polysilicon or boron-doped amorphous silicon.

In one embodiment shown in FIG. 18B, a first horizontal plane HP1 including bottommost surfaces of vertical semiconductor material layers (601, 602) in the memory stack structures 55 is vertically spaced from a second horizontal plane HP2 including bottommost surfaces of vertical semiconductor material layers (601, 602) in the support pillar structures 155 by a vertical distance greater than 50% of a total thickness tt of the first alternating stack (132, 146, 165, 11, 111, 131, 133).

The contact region 200 includes a staircase region, in which each electrically conductive layer (146, 246) laterally extends farther than any overlying electrically conductive layer (146, 246). It should be noted that a topmost electrically conductive layer 246 of the second alternating stack (232, 246) has no overlying electrically conductive layers 246 and thus does not extend father than an overlying electrically conductive layer 246 for this reason. In one embodiment, the support pillar structures 155 can be located in the staircase region, and the memory stack structures 55 can extend through a memory array region 100. In one embodiment, each of the memory stack structures 55 and support pillar structures 155 can comprise a lateral stack of a memory film 50 comprising a charge trapping material and a tunneling dielectric that laterally surrounds a respective vertical semiconductor material layer (601, 602).

The monolithic three-dimensional memory device can further include drain regions 63 contacting a top portion of each vertical semiconductor material layer (601, 602) in the memory stack structures 55; dummy drain regions 163 contacting a top portion of each vertical semiconductor material layer (601, 602) in the support pillar structures 155; a contact level dielectric layer 80 contacting an entirety of all top surfaces of the dummy drain regions 163; and drain contact via structures 88 extending through the contact level dielectric layer 80 and contacting the drain regions 63.

Each support pillar structure 155 is an electrically inactive component, i.e., a component that does not function electrically, by virtue of not being electrically shorted to a conductive component (except for being connected to the semiconductor material of the semiconductor substrate (9, 10) through a resistive intrinsic semiconductor material region 131 if the dielectric etch stop layer 21 is not present and/or inadvertently being connected to a word line/electrically conductive layer (146, 246) at the potential short regions, PSR, shown in FIG. 18B). Each semiconductor pillar structure 155 includes a memory film 50 which is a dummy memory film (i.e., an electrically inactive memory film), a semiconductor channel 60 which is a dummy semiconductor channel (i.e., an electrically inactive semiconductor channel), a dielectric core 62, and a drain region 63 which is a dummy drain region (i.e., an electrically inactive drain region).

Each dummy memory film 50 in the at least one support pillar structure 155 is formed during the same step as the memory film 50 in each memory stack structure 55. Each dummy tunneling dielectric layer in the at least one support pillar structure 155 is formed during the same step as the tunneling dielectric layer in each memory stack structure 55. Each dummy semiconductor channel in the at least one support pillar structure 155 is formed during the same step as the semiconductor channel in each memory stack structure 55. Each dummy drain region 63 in the at least one support pillar structure 155 is formed during the same step as the drain region 63 in each memory stack structure 55.

In one embodiment, the monolithic three-dimensional memory structure comprises a monolithic three-dimensional NAND memory device. First spacer material layers (such as first sacrificial material layer 142) in a first alternating stack (132, 142) and second spacer material layers (such as second sacrificial material layers 242) can be formed as, or can be replaced with, first electrically conductive layers 146 and second electrically conductive layers 246, respectively. The first and second electrically conductive layers (146, 246) can comprise, or can be electrically connected to, a respective word line of the monolithic three-dimensional NAND memory device.

The substrate (9, 10) can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

As discussed above, surface damage can be introduced on the top surfaces of the first support openings 321 contacting bottom surfaces of the first retro-stepped dielectric material portion 165, and on the top surfaces of the second support openings 341 contacting bottom surfaces of the second retro-stepped dielectric material portion 265. Formation of memory films 50 on such damaged surfaces can result in structural defects in the memory films 50 that can induce a leakage path between the electrically conductive layers (146, 246) and the semiconductor substrate (9, 10) through the support pillar structures 155. The exemplary structure of the present disclosure provides an optional etch stop layer 21 between the substrate (9, 10) and potential short regions PSR (shown in FIG. 18B) which may contain defects in the memory films 50 due to the surface damage to the first and second sacrificial material layers (142, 242) at the processing steps of FIGS. 3A, 3B, 9A, and 9B. Further, the exemplary structure of the present disclosure includes a substantially intrinsic semiconductor material portion comprising the support-opening semiconductor material portions 131 between the substrate (9, 10) and the potential short regions PSR. Thus, even if electrical leakage paths are formed between the electrically conductive layers (i.e., word lines) (146, 246) and the dummy channel (601, 602) in the support pillar structures 155 in the potential short regions PSR, any leakage current between the electrically conductive layers (146, 246) and the substrate (9, 10) is blocked by the low conductivity, intrinsic support-opening semiconductor material portions 131 and/or optionally by the dielectric etch stop layer 21 (if present). Thus, the structure of the present disclosure can reduce leakage current between the electrically conductive layers (146, 246) and the semiconductor substrate (9, 10) through the support pillar structures 155.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A monolithic three-dimensional memory device comprising:
   a lower tier structure comprising a first alternating stack of first insulating layers and first electrically conductive layers and located over a substrate;
   an upper tier structure comprising a second alternating stack of second insulating layers and second electrically conductive layers and located over the lower tier structure;
   memory stack structures and support pillar structures extending through the second alternating stack and at least an upper portion of the first alternating stack; and support pillar structures extending through the second alternating stack, wherein:

each of the memory stack structures and support pillar structures comprises a respective vertical semiconductor material layer; and each vertical semiconductor material layer in the support pillar structures has a bottommost surface located above a horizontal plane including bottommost surfaces of vertical semiconductor material layers within the memory stack structures.

2. The monolithic three-dimensional memory device of claim 1, further comprising doped semiconductor material portions and intrinsic semiconductor material portions, wherein:

each of the support pillar structures overlies one of the doped semiconductor material portions in contact with a bottom surface of a respective vertical semiconductor material layer; and each of the doped semiconductor material portions overlies a respective one of the intrinsic semiconductor material portions.

3. The monolithic three-dimensional memory device of claim 2, further comprising an etch stop layer which comprises:

a first horizontal portion located between the first alternating stack and the second alternating stack;

a second horizontal portion located between the intrinsic semiconductor material portions and the substrate; and vertical portions laterally surrounding respective doped semiconductor material portions.

4. The monolithic three-dimensional memory device of claim 3, further comprising:

first epitaxial semiconductor portions underlying respective memory stack structures; and second epitaxial semiconductor portions underlying the support pillar structures.

5. The monolithic three-dimensional memory device of claim 4, wherein:

the second horizontal portion of the etch stop layer is located between the intrinsic semiconductor material portions and the second epitaxial semiconductor portions; and each of the first and second epitaxial semiconductor portions includes a respective single crystalline semiconductor material that is epitaxially aligned to a single crystalline semiconductor material of the substrate.

6. The monolithic three-dimensional memory device of claim 5, wherein:

the semiconductor material portions comprise polysilicon or amorphous silicon;

the intrinsic semiconductor material portions comprise undoped polysilicon or undoped amorphous silicon; and the doped semiconductor material portions comprise boron-doped polysilicon or boron-doped amorphous silicon.

7. The monolithic three-dimensional memory device of claim 1, wherein a first horizontal plane including bottommost surfaces of vertical semiconductor material layers in the memory stack structures is vertically spaced from a second horizontal plane including bottommost surfaces of vertical semiconductor material layers in the support pillar structures by a vertical distance greater than 50% of a total thickness of the first alternating stack.

8. The monolithic three-dimensional memory device of claim 1, further comprising a staircase region in which each electrically conductive layer laterally extends farther than any overlying electrically conductive layer.

9. The monolithic three-dimensional memory device of claim 8, wherein:

the support pillar structures are located in the staircase region; and the memory stack structures extend through a memory array region.

10. The monolithic three-dimensional memory device of claim 1, wherein each of the memory stack structures and support pillar structures comprises a lateral stack of a memory film comprising a charge trapping material and a tunneling dielectric that laterally surrounds a respective vertical semiconductor material layer.

11. The monolithic three-dimensional memory device of claim 1, further comprising:

drain regions contacting a top portion of each vertical semiconductor material layer in the memory stack structures;

dummy drain regions contacting a top portion of each vertical semiconductor material layer in the support pillar structures;

a contact level dielectric layer contacting an entirety of all top surfaces of the dummy drain regions; and drain contact via structures extending through the contact level dielectric layer and contacting the drain regions.

12. The three-dimensional memory device of claim 1, wherein:

the three-dimensional memory device comprises a vertical NAND device located over the substrate;

the first and second electrically conductive layers comprise, or are electrically connected to, a respective word line of the NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels including the vertical semiconductor layers within the memory stack structures;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *